(12) United States Patent
Chaki

(10) Patent No.: US 12,063,051 B2
(45) Date of Patent: Aug. 13, 2024

(54) COMMUNICATION METHOD AND DEVICE USING RECURRENT DECODING ITERATIONS FOR POLAR CODES

(71) Applicant: NEC Corporation, Tokyo (JP)

(72) Inventor: Prakash Chaki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 23 days.

(21) Appl. No.: 17/917,028

(22) PCT Filed: Apr. 14, 2020

(86) PCT No.: PCT/JP2020/016477
§ 371 (c)(1),
(2) Date: Oct. 5, 2022

(87) PCT Pub. No.: WO2021/210079
PCT Pub. Date: Oct. 21, 2021

(65) Prior Publication Data
US 2023/0155606 A1 May 18, 2023

(51) Int. Cl.
*H03M 13/11* (2006.01)
*H03M 13/00* (2006.01)
(Continued)

(52) U.S. Cl.
CPC ..... *H03M 13/1108* (2013.01); *H03M 13/096* (2013.01); *H03M 13/13* (2013.01); *H03M 13/611* (2013.01)

(58) Field of Classification Search
CPC .. H03M 13/096; H03M 13/611; H03M 13/09; H03M 13/2906; H03M 13/13; H03M 13/1108
See application file for complete search history.

(56) References Cited

U.S. PATENT DOCUMENTS

2017/0353267 A1 12/2017 Kudekar et al.
2019/0132011 A1* 5/2019 Chandesris ........... H03M 13/13
(Continued)

FOREIGN PATENT DOCUMENTS

JP 2019-519131 A 7/2019

OTHER PUBLICATIONS

F. Ercan, C. Condo and W. J. Gross, "Improved Bit-Flipping Algorithm for Successive Cancellation Decoding of Polar Codes," in IEEE Transactions on Communications, vol. 67, No. 1, pp. 61-72, Jan. 2019.*

(Continued)

*Primary Examiner* — Steve N Nguyen
(74) *Attorney, Agent, or Firm* — Sughrue Mion, PLLC

(57) ABSTRACT

A communication method and device which can improve error correction performance and power consumption without increasing hardware complexity is disclosed. A communication apparatus includes: a decoder for polar codes, that decodes a codeword in which a frame is partitioned according to a predetermined partitioning rule and each partition includes at least one check bit computed by a predefined checksum equation; a memory that stores a frozen set including frozen bit indices, a non-frozen set including non-frozen bit indices, and a susceptible to error (STE) set including STE indices susceptible to decoding error for each partition; and a controller configured to: compute a check sum of at least one decoded bit for each partition according to the predefined checksum equation; responsive to failure of checksum, initiate a recurrent decoding attempt on the partition; and perform a bit-inversion operation on at least one STE index in each recurrent decoding attempt.

20 Claims, 23 Drawing Sheets

(51) Int. Cl.
*H03M 13/09* (2006.01)
*H03M 13/13* (2006.01)

(56) References Cited

U.S. PATENT DOCUMENTS

| | | | |
|---|---|---|---|
| 2019/0149267 A1 | 5/2019 | Cirkic et al. | |
| 2019/0273512 A1* | 9/2019 | Chen | H03M 13/09 |
| 2019/0296859 A1* | 9/2019 | Jang | H03M 13/09 |
| 2020/0177211 A1* | 6/2020 | Fazeli Chaghooshi | H03M 13/2933 |
| 2022/0006475 A1* | 1/2022 | Gazi | H03M 13/37 |

OTHER PUBLICATIONS

F. Ercan, C. Condo, S. A. Hashemi and W. J. Gross, "Partitioned Successive-Cancellation Flip Decoding of Polar Codes," 2018 IEEE International Conference on Communications (ICC), Kansas City, MO, USA, 2018.*

Y. Fang, J. Li and Y. Lv, "Improved Segmented SC-Flip Decoding of Polar Codes Based on Gaussian Approximation," 2019 4th International Conference on Smart and Sustainable Technologies (SpliTech), Split, Croatia, 2019.*

International Search Report for PCT Application No. PCT/JP2020/016477, mailed on Dec. 22, 2020.

Written opinion for PCT Application No. PCT/JP2020/016477, mailed on Dec. 22, 2020.

E. Arikan, "Channel polarization: A method for constructing capacity-achieving codes for symmetric binary-input memoryless channels", IEEE Transactions of Information Theory, vol. 55, pp. 3051-3073, Jul. 2009.

I. Tal and A. Vardy, "List decoding of polar codes", IEEE Transactions of Information Theory, vol. 61, No. 5, pp. 2213-2226, May 2015.

Kai Niu et al. "CRC-aided decoding of polar codes", IEEE Communications Letter, vol. 16, Issue 10, Oct. 2012.

O. Afisiadis et al. "A Low-Complexity Improved Successive Cancellation Decoder for Polar Codes", IEEE, 2014 48th Asilomar Conference on Signals, Systems and Computers.

Z. Zhang, K. Qin, L. Zhang, H. Zhang, and G. T. Chen, "Progressive bit-flipping decoding of polar codes over layered critical sets," in Proc. IEEE Global Commun. (Globecom), Dec. 2017, pp. 1-6.

Furkan Ercan et al, "Partitioned Successive-Cancellation Flip Decoding of Polar Codes", arxiv.org, Cornell University Library, 201 Olin Li-brary Cornell University Ithaca, NY 14853,Nov. 29, 2017 (Nov. 29, 2017), XP081419897.

Zhang Zhijun et al, "Multi-Bit-Flipping Decoding of Polar Codes Based on Medium-Level Bit-Channels Sets", 2019 IEEE Wireless Communications and Networking Conference (WCNC), IEEE,Apr. 15, 2019 (Apr. 15, 2019), p. 1-6, XP033652278.

Li Shibao et al, "Generalized Segmented Bit-Flipping Scheme for Successive Cancellation Decoding of Polar Codes With Cyclic Redundancy Check", IEEE Access,vol. 7, Jun. 13, 2019 (Jun. 13, 2019), p. 83424-83436, XP011733932.

Cao Anqi et al, "An LLR-Based Segmented Flipped SCL Decoding Algorithm for Polar Codes", 2019 IEEE/CIC International Conference on Communications in China (ICCC), IEEE,Aug. 11, 2019 (Aug. 11, 2019), p. 724-729, XP033623152.

Huawei et al, "Polar Code Construction for NR", vol. RAN WG1, No. Lisbon, Portugal; Oct. 10, 2016-Oct. 14, 2016, Oct. 9, 2016 (Oct. 9, 2016), 3GPP Draft; R1-1608862 Polar Code Constuction for NR, 3rd Generation Partnership Project (3GPP), Mobile Competence Centre ; 650, Route Des Lucioles ; F-06921 Sophia-Antipolis Cedex ; France, Retrieved from the Internet:URL:http://www.3gpp.org/ftp/Meetings_3GPP_SYNC/RAN1/Docs/.

Zhang Zhaoyang et al, "Progressive Bit-Flipping Decoding of Polar Codes: A Critical-Set Based Tree Search Approach", IEEE Access,vol. 6, Oct. 8, 2018 (Oct. 8, 2018), p. 57738-57750, XP011703548.

Wang Xiumin et al, "Improved Multiple Bit-Flipping Fast-SSC Decoding of Polar Codes", IEEE Access, IEEE, USA,vol. 8, Aug. 2020.

JP Office Action for JP Application No. 2022-560518, mailed on Nov. 28, 2023 with English Translation.

Rui Guo et al., Multi-CRC Polar Codes and M-SCFlip-Based Decoding[online], IEEE Access, 2019 [Nov. 17, 2023 search], vol. 7, pp. 98366-98373, Internet<URL:https://ieeexplore.ieee.org/document/8756253>.

* cited by examiner

FIG. 3

ENCODER (POLAR CODE)

$$[U_0 \ U_1 \ U_2 \ U_3 \ U_4 \ U_5 \ U_6 \ U_7] \begin{pmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{pmatrix} = [C_0 \ C_1 \ C_2 \ C_3 \ C_4 \ C_5 \ C_6 \ C_7]$$

INPUT VECTOR $U$     GENERATOR MATRIX $G$     CODEWORD $C$

COMMUNICATION METHOD AND DEVICE USING RECURRENT DECODING ITERATIONS FOR POLAR CODES

This application is a National Stage Entry of PCT/JP2020/016477 filed on Apr. 14, 2020, the contents of all of which are incorporated herein by reference, in their entirety.

TECHNICAL FIELD

The present invention relates to encoding and decoding techniques for polar codes.

BACKGROUND

Polar codes, introduced in NPL1, are a family of codes that can be used to achieve symmetric capacity in binary input discrete memoryless symmetric (BI-DMS) channels. In a typical encoding of K message bits using polar codes of length N over a binary input additive white Gaussian noise (BI-AWGN) channel, K indices with relatively high reliability are chosen which are referred to as non-frozen indices. Different metrics can be used to quantify the reliability of an index. High reliability can be manifested in low error probability, or low Bhattacharyya parameter. Message bits generated by a message source are put in these non-frozen indices, or non-frozen set. The remaining N-K indices of relatively low reliability may be referred to as frozen indices or frozen set. Frozen indices may be filled with a pre-determined bit (for example 0). Thus a vector of length N is constructed that contains K bits of information. By multiplying this vector with a N×N generator matrix of polar codes, one can obtain a codeword of polar codes. Polar codeword thus obtained may be modulated using a modulation scheme and transmitted over a communication channel.

A typical receiver for polar codes may employ a successive cancellation (SC) decoding algorithm or successive cancellation list (SCL) decoding algorithm. An SC decoding algorithm, described in NPL 1, may decode each bit in a sequential manner, attempting to decode each bit only once. Decoding result of each bit may be used in the decoding of the successive bits. An SCL decoder, described in NPL 2 and NPL 3, includes multiple SC decoders which may be run in parallel. For example, an SCL decoder with list size L may run L number of SC decoders in parallel. That implies, each bit may be decoded into at most L possible decoding estimates. Hard decision (about which one out of the L estimates is correct) may not be taken immediately. Once decoding of the entire frame of N bits is completed, then a sequence of decoded estimates that has maximum likelihood may be chosen as the desired output. In another variant, a CRC-Aided SCL (CA-SCL) decoder may perform CRC test on the L sequences of decoding estimates (i.e., output of L number of SC decoders running in parallel) and select one sequence that passes the CRC test. The SCL or CA-SCL decoder may require very high hardware complexity as it runs L number of SC decoders in parallel.

As illustrated in FIG. 1, if a decoding error happens at any position, this decoding error may affect the decoding of the later bits by means of error propagation. Once decoding of all bits in a frame is finished, the frame may be subjected to a validation test (for example, using cyclic redundancy check (CRC)). If it is discovered that the frame is in error, a wastage of computing resources, power and decoding time may be incurred. Decoding error can be caused by channel noise or by error propagation due to a previous decoding error. The first decoding error in a frame always happens due to channel noise, because there is no error bit before that. Accordingly, error propagation does not affect the frame error rate (FER). Rather, error propagation only increases bit error rate (BER). Usually there are fewer errors introduced by the channel noise. Most bit errors are due to error propagation. Accordingly, correcting only the first error bit has significant performance improvement.

As a technique of identifying the first error that occurs during SC decoding, a SC flip decoder has been proposed in NPL4. In FIG. 1, the SC flip decoder first performs the SC decoding to produce a first estimated codeword ^U1. When the codeword ^U1 fails a CRC check test, the SC flip decoder goes back to start and performs at least one additional attempt to identify the location of the first error that occurred in the codeword ^U1 and flipping the erroneous bit. The SC flip decoding operation may perform several decoding attempts, flipping a different decoded bit in each attempt, and terminates when a valid codeword ^U has been found. Another bit-flipping decoder has been proposed in NPL5. NPL5 shows a method to find indices that may contain the first channel-noise-induced bit-error with high probability.

CITATION LIST

Non Patent Literature

[NPL 1]
  E. Arikan, "Channel polarization: A method for constructing capacity-achieving codes for symmetric binary-input memoryless channels", IEEE Transactions of Information Theory, vol. 55, pp. 3051-3073, July 2009.

[NPL 2]
  1. Tal and A. Vardy, "List decoding of polar codes", IEEE Transactions of Information Theory, vol. 61, no. 5, pp. 2213-2226, May 2015.

[NPL 3]
  Kai Niu et al. "CRC-aided decoding of polar codes", IEEE Communications Letter, vol. 16, issue 10, October 2012.

[NPL 4]
  O. Afisiadis et al. "A Low-Complexity Improved Successive Cancellation Decoder for Polar Codes", IEEE, 2014 48th Asilomar Conference on Signals, Systems and Computers.

[NPL 5]
  Z. Zhang, K. Qin, L. Zhang, H. Zhang, and G. T. Chen, "Progressive bit-flipping decoding of polar codes over layered critical sets," in Proc. IEEE Global Commun. (Globecom), December 2017, pp. 1-6.

SUMMARY

Technical Problem

In SC decoding, the attempt to decode each bit is performed only once. In case a decoding error happens, it may not be able to notice it or correct it. The decoding error may be identified by doing CRC test on the decoded frame after SC decoder has finished its operation. This can cause waste of decoding time and unnecessary power consumption. Thus a conventional SC decoder may not be able to go back and correct a decoding error committed in the past.

In SCL decoding, hardware resources may be increased to run multiple SC decoders in parallel. At the final stage, one out of the many decoding paths may be chosen as the final output. This improves the decoding performance, but at the cost of increased hardware resources. Thus such a scheme may be too expensive for a resource-constrained communication terminal employing polar codes such as a sensor mote or an IoT (Internet of Things) device.

In SC flip decoding, it may be necessary to perform many attempts to identify the location of the first error. Since the power consumption increases with the number of attempts to identify the location of the first error, it is preferable for a communication terminal as powered by battery or solar cell to find the first error location as early as possible.

To employ polar codes in resource-constrained communication terminals like sensor motes or IoT terminals, it may be necessary to produce better error correction performance than SC decoder, but without affording high hardware complexity like SCL decoder and increased power consumption like SC flip decoder.

An object of the present invention is to provide communication method and device which can improve error correction performance and power consumption without increasing hardware complexity.

Solution to Problem

According to a first aspect of the present invention, a communication apparatus includes: a decoder for polar codes, that decodes a codeword in which a frame is partitioned according to a predetermined partitioning rule and each partition includes at least one check bit computed by a predefined checksum equation; a memory that stores a frozen set including frozen bit indices, a non-frozen set including non-frozen bit indices, and a susceptible to error (STE) set including STE indices susceptible to decoding error for each partition; and a controller configured to: compute a check sum of at least one decoded bit for each partition according to the predefined checksum equation; responsive to failure of checksum, initiate a recurrent decoding attempt on the partition; and perform a bit-inversion operation on at least one STE index in each recurrent decoding attempt.

According to a second aspect of the present invention, a communication method in a communication device which receives a codeword from another communication device, includes: by a decoder for polar codes, decoding the codeword in which a frame is partitioned according to a predetermined partitioning rule and each partition includes at least one check bit computed by a predefined checksum equation; by a memory, storing a frozen set including frozen bit indices, a non-frozen set including non-frozen bit indices, and a susceptible to error (STE) set including STE indices susceptible to decoding error for each partition; by a controller, computing a check sum of at least one decoded bit for each partition according to the predefined checksum equation; responsive to failure of checksum, initiating a recurrent decoding attempt on the partition; and performing a bit-inversion operation on at least one STE index in each recurrent decoding attempt.

According to a third aspect of the present invention, a communication system comprising: a sender device including an encoder for polar codes, that sends a codeword, wherein a frame is partitioned according to a predetermined partitioning rule, each partition including at least one check bit computed by a predefined checksum equation; and a receiver device including: a decoder for polar codes, that decodes the codeword received from the sender device; a memory that stores a frozen set including frozen bit indices, a non-frozen set including non-frozen bit indices, and a susceptible to error (STE) set including STE indices susceptible to decoding error for each partition; and a controller configured to: compute a check sum of at least one decoded bit for each partition according to the predefined checksum equation; responsive to failure of checksum, initiate a recurrent decoding attempt on the partition; and perform a bit-inversion operation on at least one STE index in each recurrent decoding attempt.

According to a fourth aspect of the present invention, a computer-readable program stored in a non-transitory recording medium in a communication device which receives a codeword in which a frame is partitioned according to a predetermined partitioning rule and each partition includes at least one check bit computed by a predefined checksum equation, the program comprising a set of instructions to: decode the codeword; store a frozen set including frozen bit indices, a non-frozen set including non-frozen bit indices, and a susceptible to error (STE) set including STE indices susceptible to decoding error for each partition; compute a check sum of at least one decoded bit for each partition according to the predefined checksum equation; responsive to failure of checksum, initiate a recurrent decoding attempt on the partition; and perform a bit-inversion operation on at least one STE index in each recurrent decoding attempt.

According to a fifth aspect of the present invention, a communication apparatus includes: a memory that stores a frozen set including frozen bit indices, a non-frozen set including non-frozen bit indices, and a susceptible to error (STE) set including STE indices susceptible to decoding error for each partition; an encoder for polar codes, that encodes an input vector to output a codeword; and a controller configured to: partition a frame into at least one partition according to a predetermined partitioning rule based on the STE indices, each partition including at least one check bit computed by a predefined checksum equation; and construct the input vector by putting information bits, the at least one check bit and frozen bits in the frame.

As described above, according to the present invention, it is possible to predict the position of a decoding error with high accuracy, resulting in improved error correction performance and power consumption without increasing hardware complexity.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims. In addition to the objects mentioned, other obvious and apparent advantages of the invention will be reflected from the detailed specification and drawings.

BRIEF DESCRIPTION OF DRAWINGS

FIG. 3 is a schematic diagram illustrating an encoding operation using an example of the generator matrix of polar codes for generally explaining an encoding operation.

DETAILED DESCRIPTION

Hereinafter, the word "exemplary" is used herein to mean "serving as an example, instance, or illustration". Any embodiment described herein as "exemplary" is not necessarily to be construed as preferred or advantageous over other embodiments.

1. OUTLINE OF EXEMPLARY EMBODIMENTS

The conventional technical problems as discussed above can be solved by one or more variants of the exemplary embodiments of the present invention.

In this present disclosure, a method for decoding a codeword over multiple decoding attempts in an iterative manner is discussed. If an initial decoding attempt results in a decoding failure, then one or more recurrent decoding attempts may be performed. A recurrent decoding attempt may constitute decoding the same frame again, excepting the fact that one or more decoded bits in a recurrent decoding attempt may be inverted. The decoding process is normally resumed after the bit-inversion operation. The maximum number of such recurrent decoding attempts may be predetermined. If no decoding failure is detected following a decoding attempt, no recurrent decoding attempt may be needed. Since the same decoder hardware is used for each recurrent decoding attempt, no additional hardware resource may be needed as compared to a conventional SC decoder, excepting in some embodiments where some additional memory may be required.

The recurrent decoding attempts may be premised on pre-coding and encoding for polar codes at a sender device. The pre-coding and encoding operations are described hereinafter.

1.1) Pre-Coding and Encoding Operations

Figure 1:
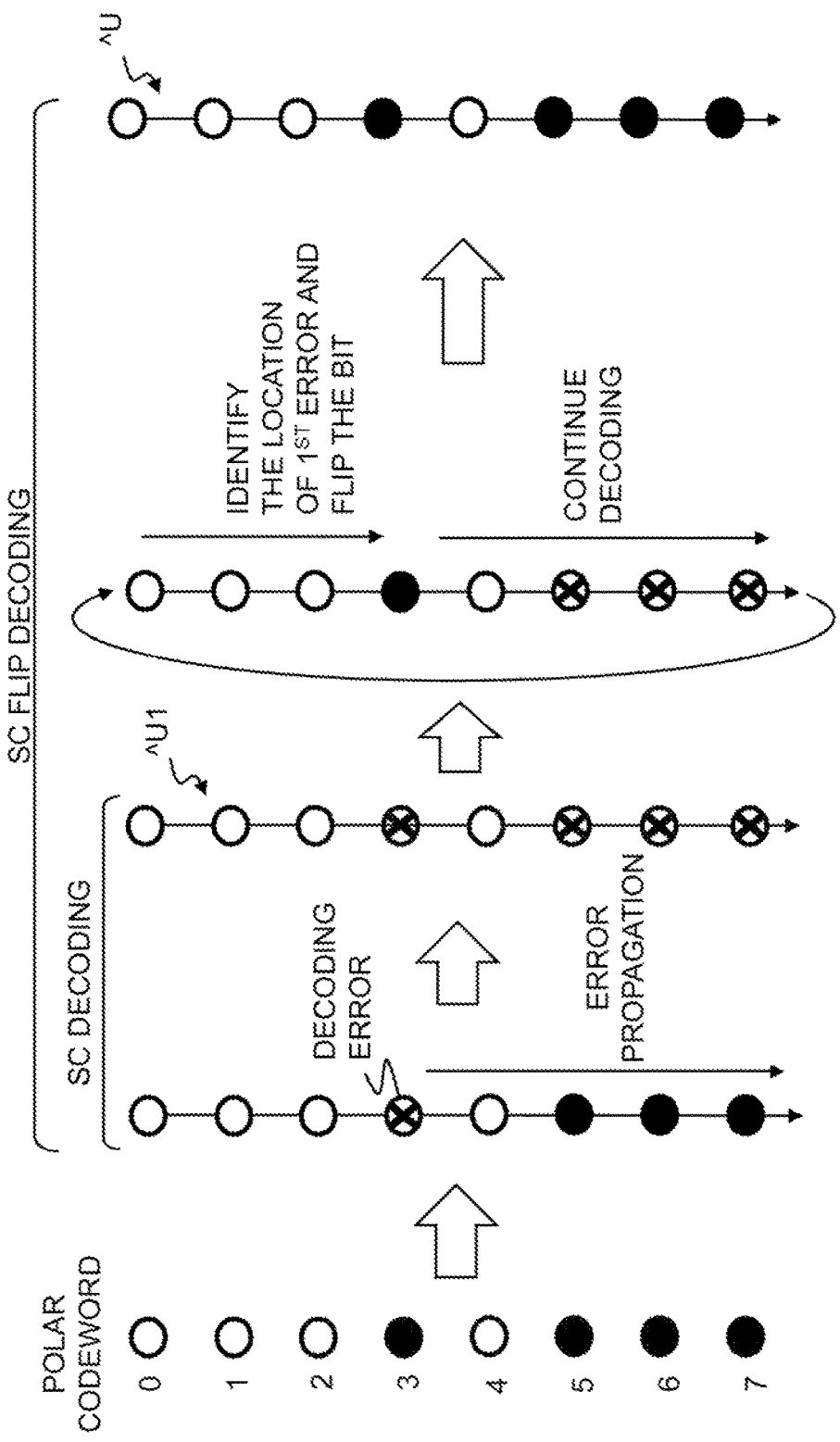
FIG. 1 is a schematic diagram explaining decoding sequences of conventional SC decoding and SC flip decoding.
Figure 2:
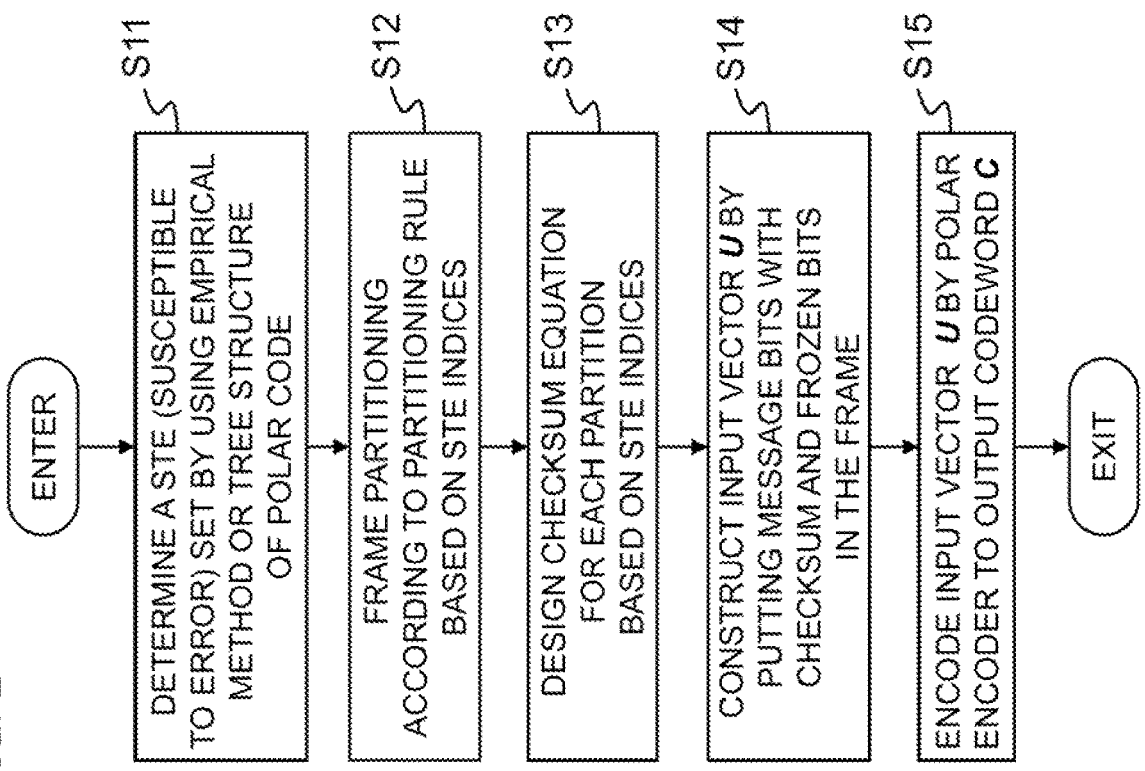
FIG. 2 is a flowchart illustrating an outline of pre-coding operations according to an embodiment of the present invention.

As illustrated in FIG. 2, a set of Susceptible To Error (STE) indices is determined at first by using empirical method or tree structure of polar codes (operation S11). A set of indices may be constructed which is highly susceptible to contain a decoding error. Such a set is henceforth referred to as Susceptible To Error (STE) set, which will be described later. Using the STE set, a frame is partitioned into a plurality of partitions according to a predetermined partitioning rule (operation S12). Then a checksum equation for each partition can be obtained based on STE indices of that partition (operation S13). An input vector U is constructed by putting message bits with checksum and frozen bits in the frame (operation S14) and is encoded by an encoder of polar codes to output a codeword C (operation S15). The codeword C is modulated and transmitted.

As illustrated in FIG. 3, the input vector U can be multiplied to a generator matrix G to output a codeword V. The generator matrix G may be represented as $$G = BG_2^{\otimes n} \quad \text{(Math. 1)}$$

where B is an N×N bit-reversal permutation matrix, $n = \log_2 N$, and $$G_2^{\otimes n} \quad \text{(Math. 2)}$$

is n-th Kronecker power of a matrix $G_2$ which is defined later. Note that, there can be embodiments where the codeword is generated without performing the matrix multiplication.

Hereinafter, taking pre-coding operations illustrated in FIGS. 4-6 as an example, the STE set construction and frame partitioning are described.

1.2) Construction of Susceptible to Error (STE) Set

Figure 4:
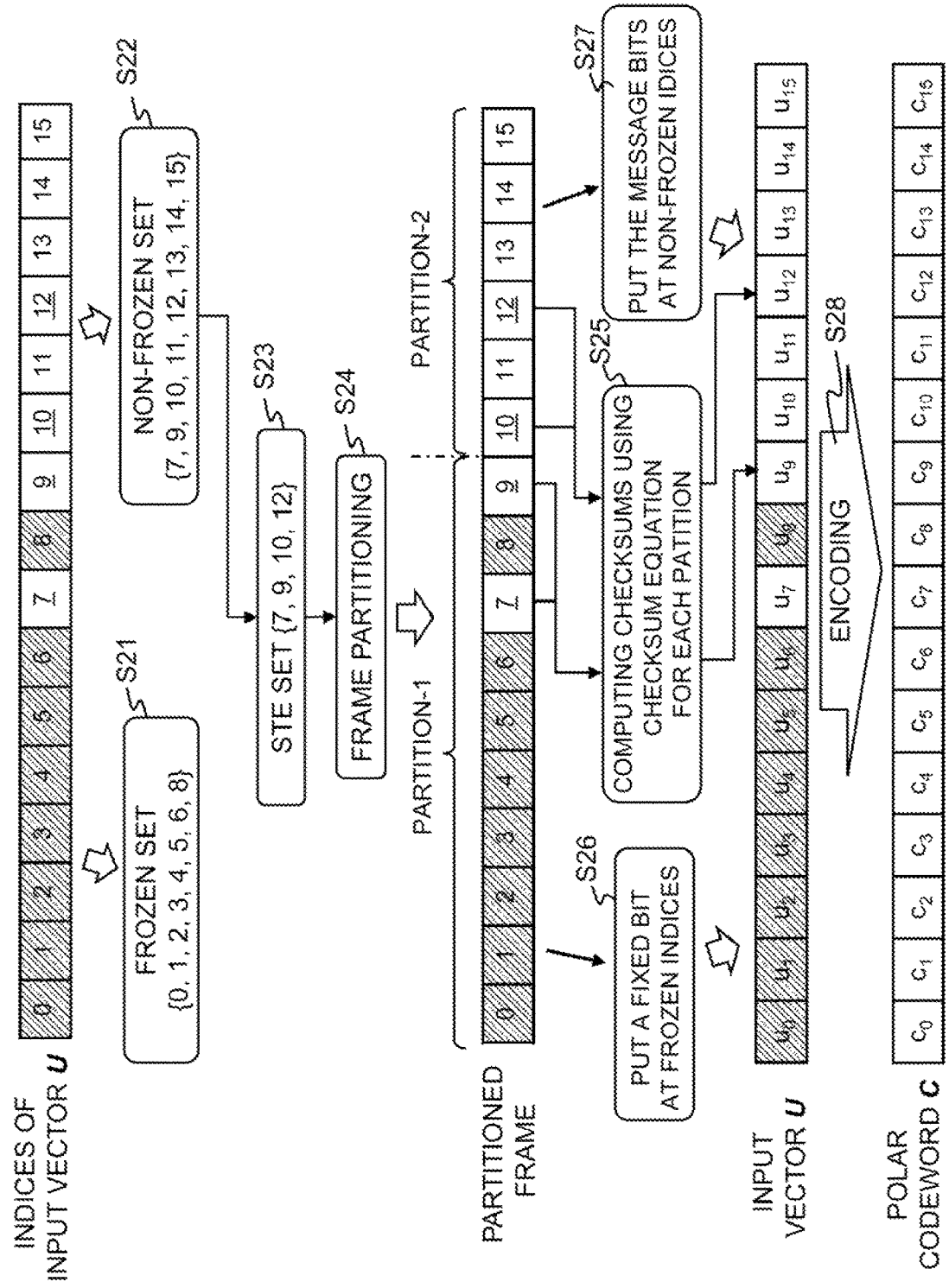
FIG. 4 is a schematic diagram illustrating a flow of pre-coding operations according to an example of the present invention.

Referring to FIG. 4, an encoding operation of polar codes is explained. To construct a polar code of length N, a sequence of indices {0, 1, . . . , N−1} may be first sorted based on their reliability values. The N indices may be arranged in ascending/descending order of reliability. For instance, the N indices are arranged in descending order of decoding error probability or Bhattacharyaa parameter (Z). Note that Bhattacharyya parameter is used as a metric for decoding error probability. Such a sorted sequence of indices may be stored in memory.

In FIG. 4, for N=16 and K=8, the indices 0, 1, 2, 3, 4, 5, 6, 8 may be included in frozen set S21 (shown as shaded). The indices 7, 9, 10, 11, 12, 13, 14, 15 may be included in the non-frozen set S22. The indices in frozen set may be filled with a fixed bit (for example, "0") S26. The message bits may be put in the non-frozen set S27. The message bits may be subjected to some pre-processing operation before putting in the non-frozen set. For example, the bits put in the non-frozen set may be a parity-check code or a CRC code, or a hash code. In the example shown in FIG. 4, the STE set S23 containing indices {7, 9, 10, 12} is constructed. A STE set may be obtained by empirical method or analytical method.

According to the empirical method, a computer simulation may be run iteratively for a large number of times to obtain the probability that decoding error happens at a given index. More specifically, the probability that first decoding error of a frame happens at a given index of the frame can be found out by simulation. Then, the indices at which there is relatively high probability of occurrence of a first decoding error may be included in the STE set. Such an index may be chosen by comparing its probability of occurrence of first decoding error with a threshold value. The threshold value may be predetermined or can be dynamically chosen for a received frame. If the probability of occurrence of a first decoding error at an index is greater than the threshold value, that index may be included in the STE set. In case of polar codes decoded by SC decoder, a first decoding error can propagate to the successive bits. Hence, finding the first decoding error and correcting it can stop such error propagation.

Figure 5:
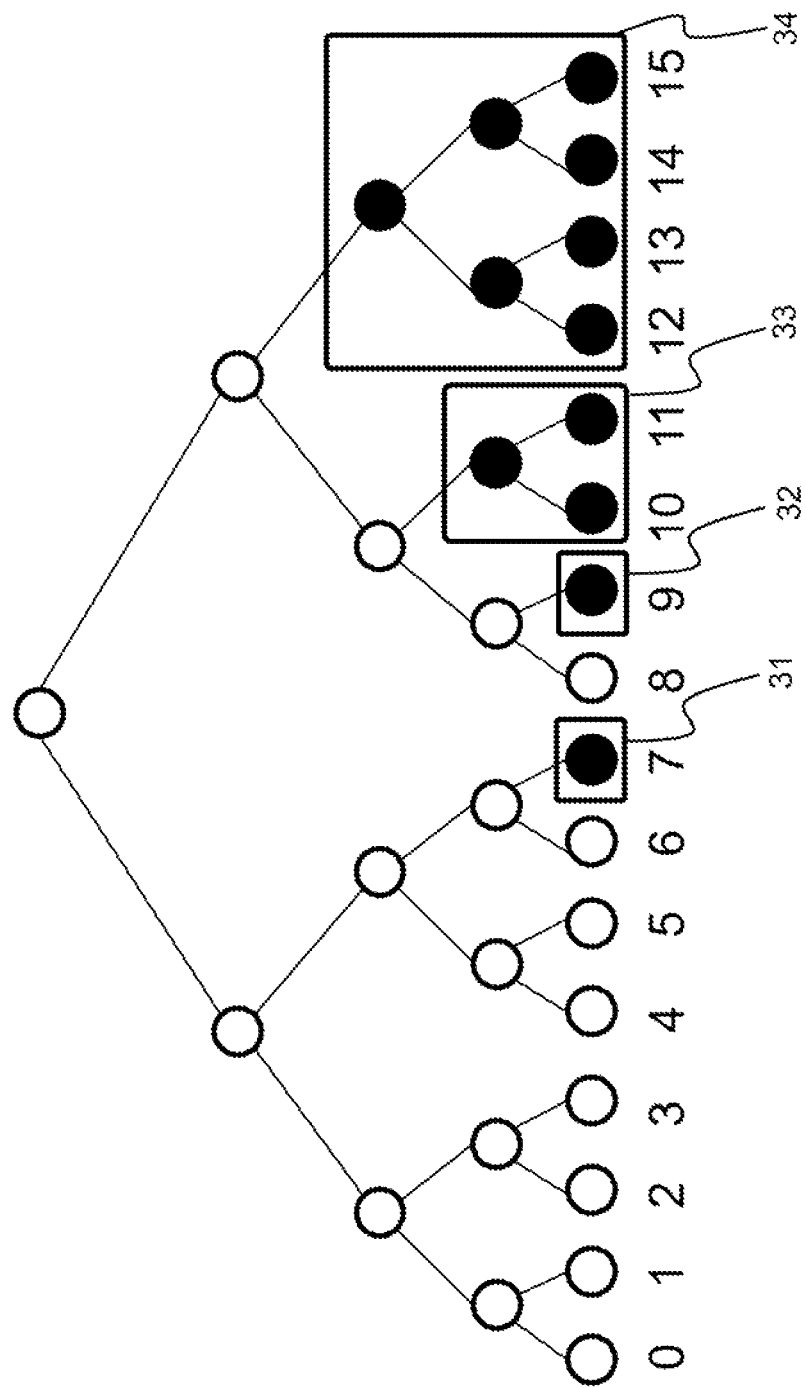
FIG. 5 is a tree diagram of polar codes showing an example for construction of STE set of indices.

According to the analytical method, an exemplary technique to design the STE set is shown in FIG. 5. The tree structure shown in FIG. 5 is that of a polar code. The leaf nodes of the tree indicate the input vector to polar encoder. The leaf nodes may also be assumed to be the output of a decoder of polar codes. In particular, the white nodes denote frozen indices and solid nodes denote non-frozen indices. Any non-leaf node that has both of its child nodes as solid node is also marked as solid node. In this way, it is possible to obtain subtrees that have only solid nodes. In the example shown in FIG. 5, four such subtrees that have all of its leaf nodes as non-frozen index are shown as reference numerals 31, 32, 33 and 34. The first (i.e., leftmost) leaf node of each such subtree may be included in the STE set. As in this example, indices 7, 9, 10, 12 are included in the STE set. Thus, the design of STE set may depend on the design of frozen and non-frozen sets as illustrated in FIG. 4.

Constructing an STE set makes it easier to find the location of decoding failure. In this present disclosure, a method may be used to detect decoding failure in each partition. Such a method can use parity check test. In an exemplary embodiment, a parity check equation for a specific partition may be designed comprising one or more STE indices of that partition. For example, it is possible that the parity check equation is designed using only STE indices of a partition. In one exemplary method, such a parity check equation can be simply a modulo-2 sum of the decoded bits at the STE indices of a partition. In another method, some other function may be used to combine the indices of a partition and obtain a checksum value. Assuming a single decoding error in a partition, such a parity checksum would fail if there is a decoding error at any one of the STE indices in that partition. Apart from parity check, other methods to detect a decoding failure in a partition may comprise of CRC check, or a hash code. For example, it may be possible at the encoder to encode the information at STE indices of a partition using a CRC code before doing polar encoding. Then at the decoder, a CRC check may be performed after decoding a partition to detect if a decoding error has occurred. The above methods may also apply for a case where there is no partition in the codeword.

1.3) Frame Partitioning

Figure 6:
FIG. 6 is a schematic diagram illustrating an example of frame partitioning according to the exemplary embodiment.

As illustrated in FIG. 6, frame partitioning S24 may be performed by dividing a frame into more than one partitions (here, three partitions). One motivation to partitioning may be to narrow down the search area for finding the decoding error. Another motivation to partitioning may be to reduce the number of computations to be done in each recurrent decoding attempt. A test to detect a decoding failure may be performed in each partition so as to find the location of decoding failure with greater accuracy. The length of each partition may be same or different. In one exemplary embodiment, a partitioning rule may be applied such that every partition has an equal number of STE indices. Other partitioning rules are also construed to be within the scope of the present invention.

Back to FIG. 4, frame partitioning S24 is performed by dividing a frame into partition-1 and partition-2 according to the partitioning rule such that every partition has an equal number of STE indices. In this example, the partition-1 has two STE indices 7, 9 and the partition-2 has two STE indices 10 and 12. Using bits at these STE indices for each partition, checksums are computed according to checksum equation (S25). How many STE indices are used for checksum bit transmission is variable. Preferably, the last or last few STE indices of each partition can be used so as to avoid increase in overhead. It is also possible to put checksum bit at an index which is non-STE non-frozen index. As a preferable example, a precoding technique used at the encoder is copying bit $u_7$ to $u_9$, and bit $u_{10}$ to $u_{12}$, before doing polar encoding. As described above, the partitioning rule is dependent on at least one of location and number of STE indices.

The indices in frozen set S21 may be filled with a fixed bit (S26). The indices in the non-frozen set S22 may be filled with message bits with checksums (S27). The input vector U thus constructed is encoded by an encoder of polar codes to output the polar codeword C (S28). The codeword C is modulated and transmitted to a receiver. At the receiver, the codeword C may be decoded by the recurrent decoding attempts as described later.

1.4) Recurrent Decoding Attempts

Figure 7:
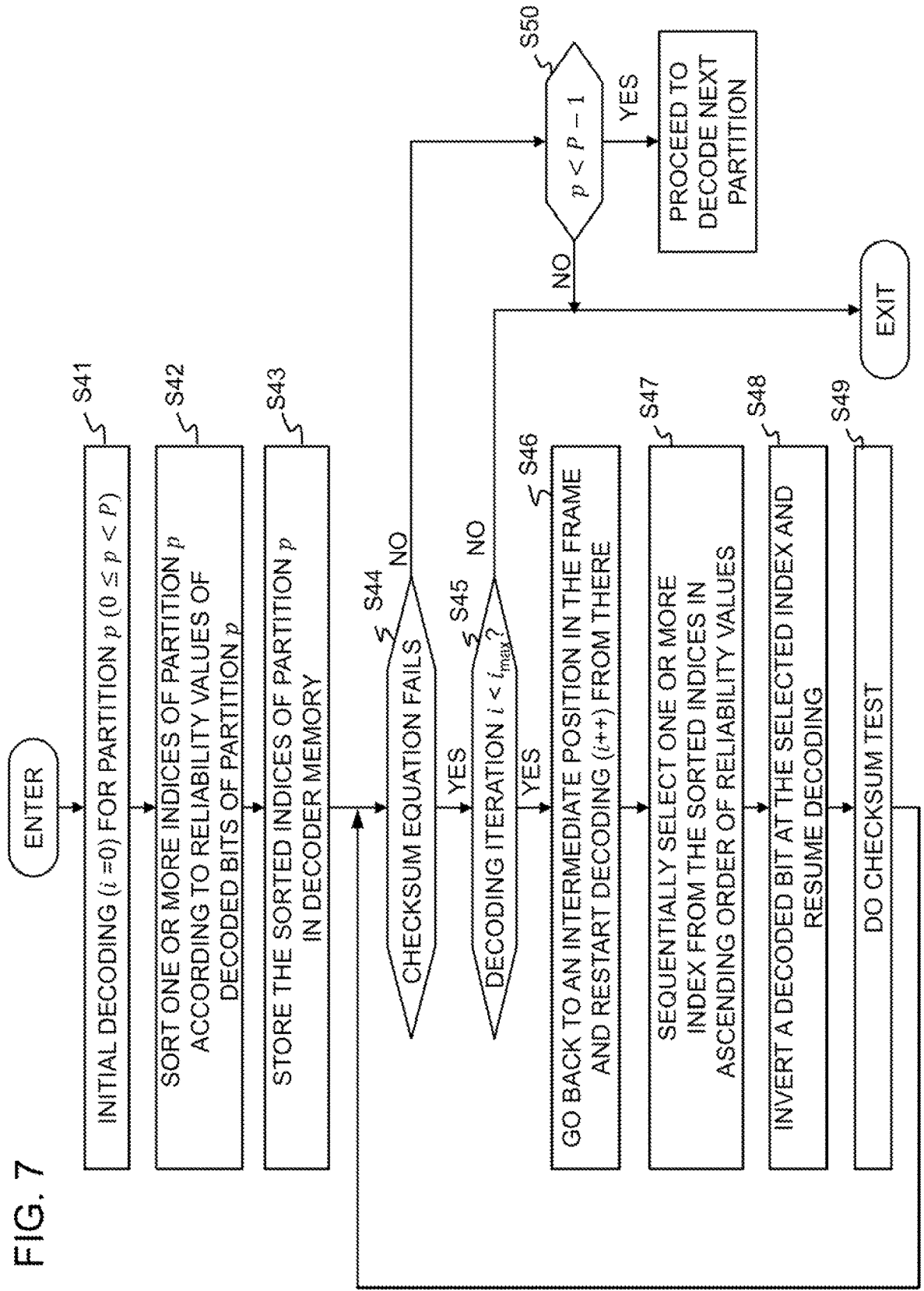
FIG. 7 is a flowchart illustrating an outline of decoding operations according to the embodiment of the present invention.

As illustrated in FIG. 7, an initial decoding is performed for a partition p which is any one of P partitions, wherein p is not smaller than 0 and smaller than P (operation S41). One or more indices of the partition p are sorted according to confidence values of decoded bits of partition p (operation S42). Details on confidence value will be described later (see "1.5) Bit-inversion" paragraph). The sorted indices of the partition p are stored in a decoder memory (operation S43). The decoded bits at predetermined indices of the partition p are used for the predetermined checksum test. Then it is checked whether the checksum equation fails and the decoding iteration i is smaller than a predetermined threshold $i_{max}$ (operation S44).

If the checksum equation fails and $i<i_{max}$ (YES in operation S44 and YES in operation S45), the decoding is restarted from an intermediate position in the frame and the decoding iteration i is incremented by one (operation S46). One or more index is sequentially selected from the sorted indices in ascending order of reliability values (operation S47) and a decoded bit at the selected index is inverted and then the decoding is resumed (operation S48). After the checksum test is performed (operation S49), the processing goes back to the operation S44. When the checksum equation is satisfied (NO in operation S44), it is checked whether the present partition p does not reach the final partition (p<P−1) (operation S50). When p<P−1 (YES in operation S50), the processing proceeds to the above-mentioned operation (S41-S50) for the next partition (p+1). When the present partition p is the final partition (YES in operation S50) or when the decoding iteration i is equal to $i_{max}$ (No in operation S45), the processing terminates.

As described above, if an initial decoding attempt results in a decoding failure, then one or more recurrent decoding attempts may be performed. A recurrent decoding attempt may constitute decoding the same frame again, excepting the fact that one or more decoded bits in a recurrent decoding attempt may be inverted. The decoding process is normally resumed after the bit-inversion operation. The maximum number ($i_{max}$) of such recurrent decoding attempts may be predetermined. If no decoding failure is detected following a decoding attempt, no recurrent decoding attempt may be needed. Since the same decoder hardware is used for each recurrent decoding attempt, no additional hardware resource may be needed as compared to a conventional SC decoder, excepting in some embodiments where some additional memory may be required.

In one embodiment of the method, in the event of decoding failure in the initial decoding attempt, a re-initiation of the decoding operation may be done at the start of the frame, while in another embodiment it is possible to re-initiate the decoding operation at an intermediate position in the frame. For example, such an intermediate position can be the start of the partition in which a decoding failure is detected. In another embodiment, the intermediate position can be the first STE index of the partition in which a decoding failure is detected. In other variants, the intermediate position may be chosen appropriately considering other benefits, including but not limited to reduction of computation, reduction of latency, improvement of throughput etc.

Figure 8:
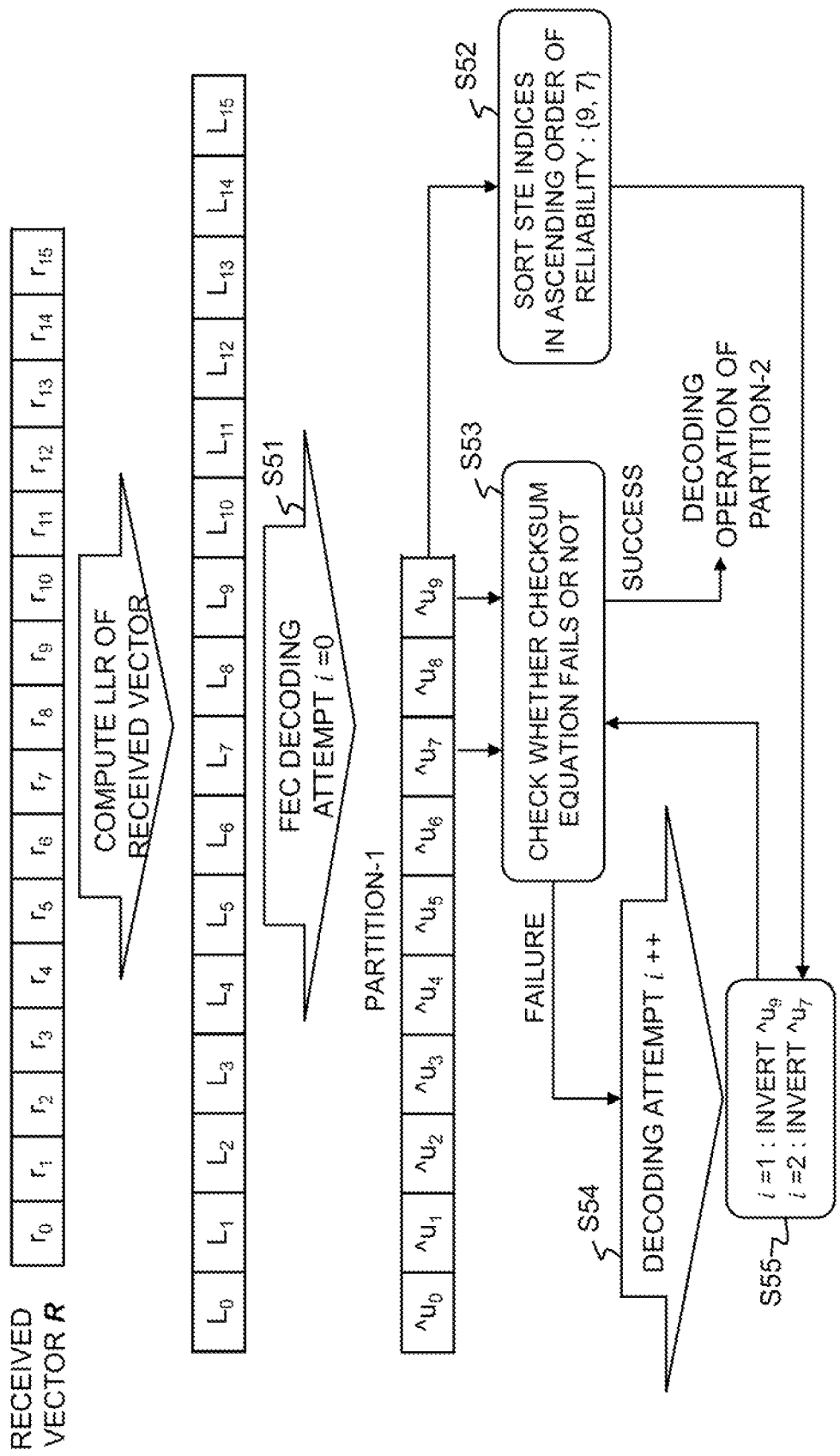
FIG. 8 is a schematic diagram illustrating a flow of decoding operations corresponding to the pre-coding operations as illustrated in FIG. 3.

Referring to FIG. 8, it is assumed that the frame is partitioned to two partitions and the STE set containing indices {7, 9, 10, 12} is constructed at the sender device as shown in FIG. 4. After the receiver device has computed the reliability values $L_0$-$L_{15}$ of the received vector R, the initial decoding attempt (i=0) is performed to obtain decoded vector ($\hat{u}_0$, $\hat{u}_1$, ..., $\hat{u}_9$) and their confidence values for the partition-1 (S51). Based on the confidence values, the STE indices are sorted in ascending order of confidence value (S52). In this example, it is assumed that the sorted STE set is {9, 7}.

Using the decoded bit $\hat{u}_7$ and $\hat{u}_9$ at the predetermined indices for checksum test, it is checked whether the predetermined checksum equation fails or not (S53). If the initial decoding attempt results in a decoding failure, then the recurrent decoding attempt is performed with inverting the bit with lower confidence value, i.e. $\hat{u}_9$ when i=1. When the checksum equation fails again, the recurrent decoding attempt is performed with inverting the remaining bit $\hat{u}_7$ when i=2 (S54, S55). When the checksum equation is satisfied, the same decoding operation is performed for the partition-2.

1.5) Bit-Inversion

According to one embodiment of the present disclosure, it is possible to obtain the confidence values of one or more decoded bits during the initial decoding attempt in a partition. The confidence values of the one or more indices may then be sent to a sorter which sorts the indices according to their confidence values. For example, the indices may be sorted in an ascending order of their confidence values, i.e., the index with lowest confidence value of its decoded bit may come first in the sorted list. In each recurrent decoding attempt that follows a failed initial decoding attempt, it is possible to select one or more bit from the sorted predetermined set of indices that has low confidence value, and the decoded bit at that index may be inverted. Such an inversion operation may be a modulo-2 sum of the decoded bit and 1. In one embodiment of the present disclosure, the confidence value used to sort the indices after the initial decoding attempt can be an absolute value of log-likelihood ratio (LLR). In one embodiment of the present disclosure, the confidence values of all decoded bits in a partition may be sent to the sorter for sorting the indices. In another embodiment, only the STE indices of a partition may be sorted using their respective confidence values.

1.6) Maximum Number of Recurrent Decoding Attempts

In one exemplary embodiment of the present disclosure, only one bit may be inverted in each recurrent decoding attempt of a partition. For example, in the first recurrent decoding attempt, the first index from the sorted STE set may be inverted. If the first decoding attempt still results in a decoding failure, then the second index from the sorted STE set may be inverted during the second recurrent decoding attempt. The maximum number of recurrent decoding attempts for a particular partition may be decided by the number of attempts it takes to correctly decode the partition, or a predetermined number of attempts, whichever is smaller. In one embodiment, maximum number of recurrent decoding attempts for a particular partition may be decided by the number of STE indices contained in that partition. The above methods may also apply for a case where there is no partition in the codeword.

2. EXEMPLARY EMBODIMENT

Hereinafter, an exemplary embodiment of the present invention will be discussed in its complete details with accompanying figures and finally explained with an exemplary scenario. The embodiment described herein is only illustrative of some specific representations of the invention acknowledging the fact that the inventive concepts can be embodied in a wide variety of contexts. Thus the exemplary embodiment does not limit the scope of the present invention.

2.1) System Configuration

A communication device according to the exemplary embodiment of the present invention will be described as a sender device or a receiver device. The sender device and the receiver device may be integrated into a single communication device.

<Sender Device>

Figure 9:
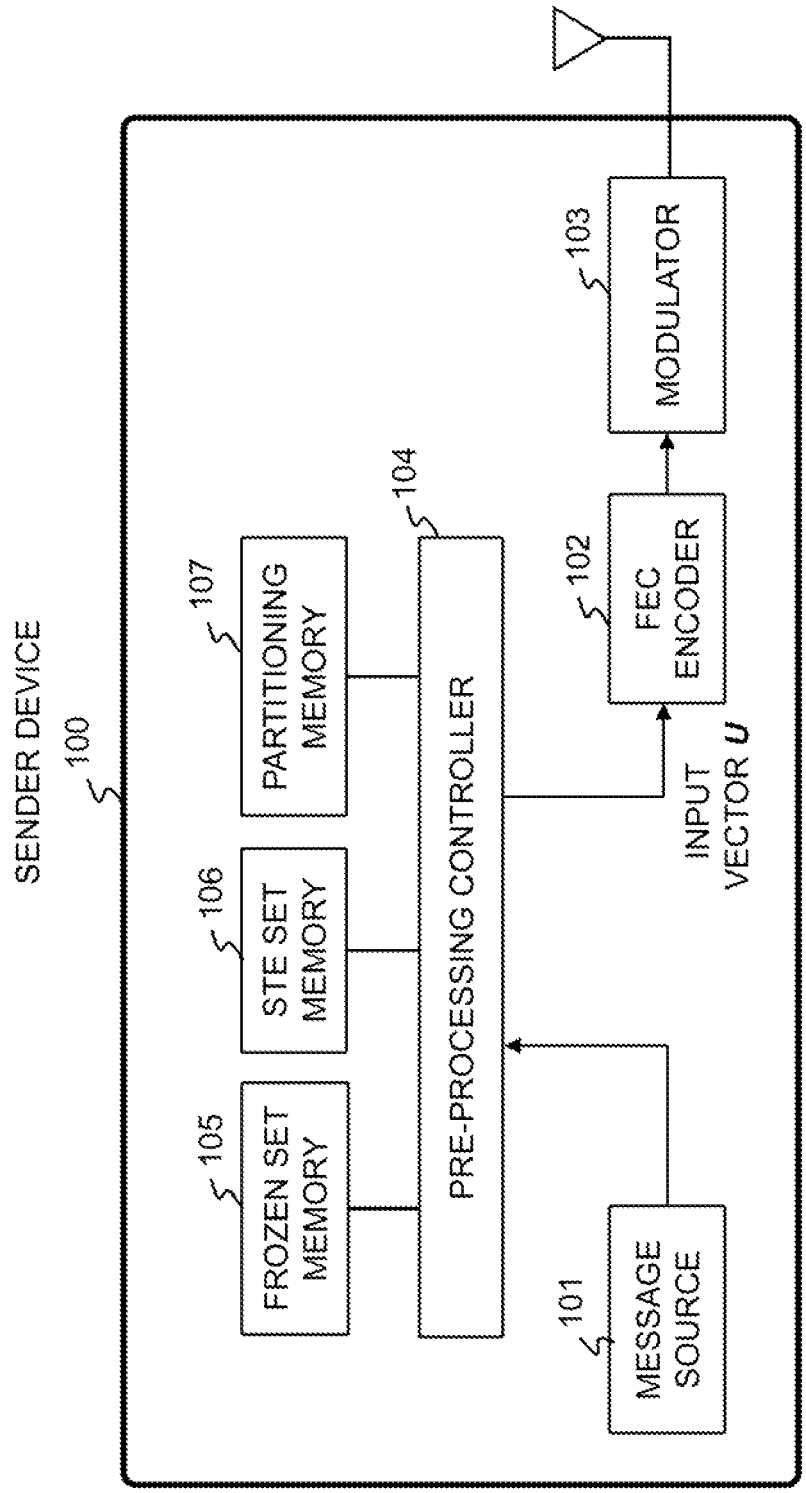
FIG. 9 is a schematic diagram illustrating a functional configuration of a sender device according to the exemplary embodiment of the present invention.

As illustrated in FIG. 9, a sender device 100 is provided with data sending functions including a message source 101, a Forward Error Correction (FEC) encoder 102 of encoding scheme for polar codes, a modulator 103, and a pre-processing block including a pre-processing controller 104, a frozen set memory 105, a STE set memory 106 and a partitioning memory 107. The FEC encoder 102 and the pre-processing controller 104 may be implemented on a processor running respective programs stored in a memory device (not shown).

Based on the frozen set indices contained in the frozen set memory 105, the pre-processing controller 104 can determine the STE set and store them in the STE set memory 106. Determining the STE set can be done by using a tree structure as shown in FIG. 5. The tree is divided into subtrees 31-34 such that all leaf nodes of each subtree are non-frozen indices. Then the first leaf node of each subtree is stored in the STE set memory 106. Alternatively, STE set of indices can be determined by offline simulations to find the probability of occurrence of first decoding error at each index. The indices with relatively high probability of occurrence of first decoding error can be stored in the STE set memory 106.

Based on the STE set of indices contained in the STE set memory 106, the pre-processing controller 104 may determine the frame partitioning. As an example, a predetermined number of frame partitions may be considered as shown by partition-1, partition-2 and partition-3 as illustrated in FIG. 6. Each partition may have one or more STE indices. In an exemplary embodiment, each partition may have an equal number of STE indices. Partitions may be chosen appropriately based on the knowledge of locations of STE indices. For example, each partition may have a number of STE indices that enables better detection of decoding error position in that partition. Thus, the indices contained in each partition may be obtained, and stored in the partitioning memory 107.

The message source 101 generates some information bits that need to be encoded and then transmitted. In one embodiment, a parity check equation corresponding to each partition may be stored in a memory (not shown). In an exemplary embodiment, a parity check equation may be the modulo-2 sum of the bits at STE indices of that partition. The pre-processing controller 104 may compute the modulo-2 sum of the STE indices and put the result in the last STE index of that partition. The resulting vector may then be sent to FEC encoder 102 which may encode the vector using an encoding algorithm of polar codes to output a polar codeword. The modulator 103 modulates the codeword and then sends it to a radio-frequency (RF) unit for transmission (not shown).

Figure 10:
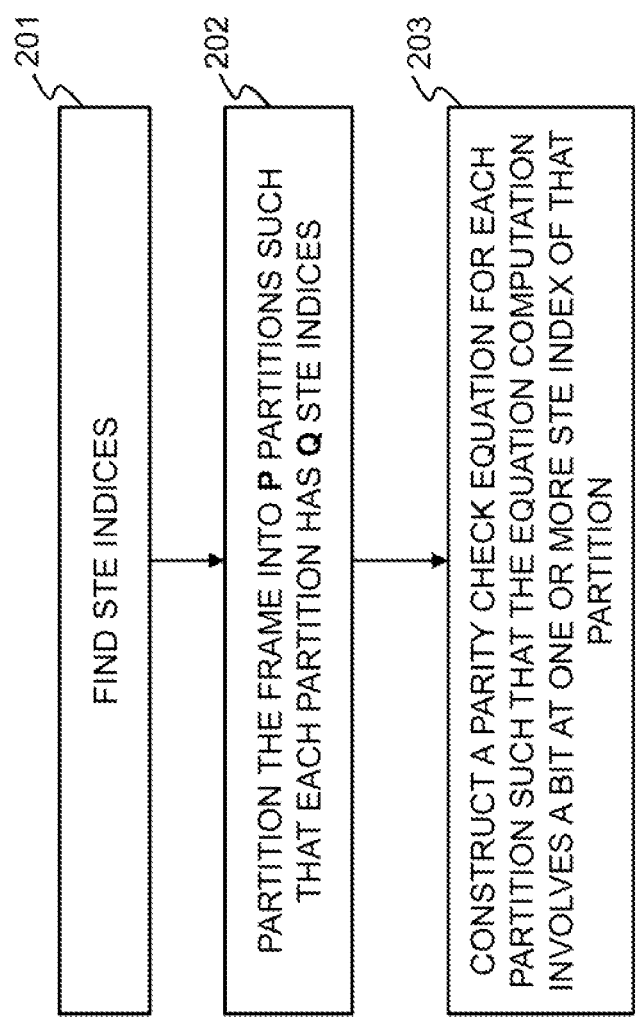
FIG. 10 is a flowchart illustrating an exemplary operation of determining frame partitions and parity check equation in each partition according to the exemplary embodiment of the present invention.

By referring to FIG. 10, a method to determine the partitioning of frame and design of parity check equation is described. A set of STE indices is determined at first using techniques discussed earlier (operation 201). A frame is partitioned into P partitions such that each partition has Q number of STE indices (operation 202). Then a parity check equation for any given partition can be obtained by taking a modulo-2 sum of the bits at the STE indices of that partition (operation 203). The method described in operation 203 does not limit the parity check equation to be a modulo-2 sum only, it includes any possible function that takes one or more STE indices of that partition and outputs one or more parity check bit. For example, it is possible that the bits at the STE indices of a partition are encoded by a CRC code or hash code; the correctness of the post-decoding value of that partition can be verified by the CRC code or hash code.

<Receiver Device>

Figure 11:
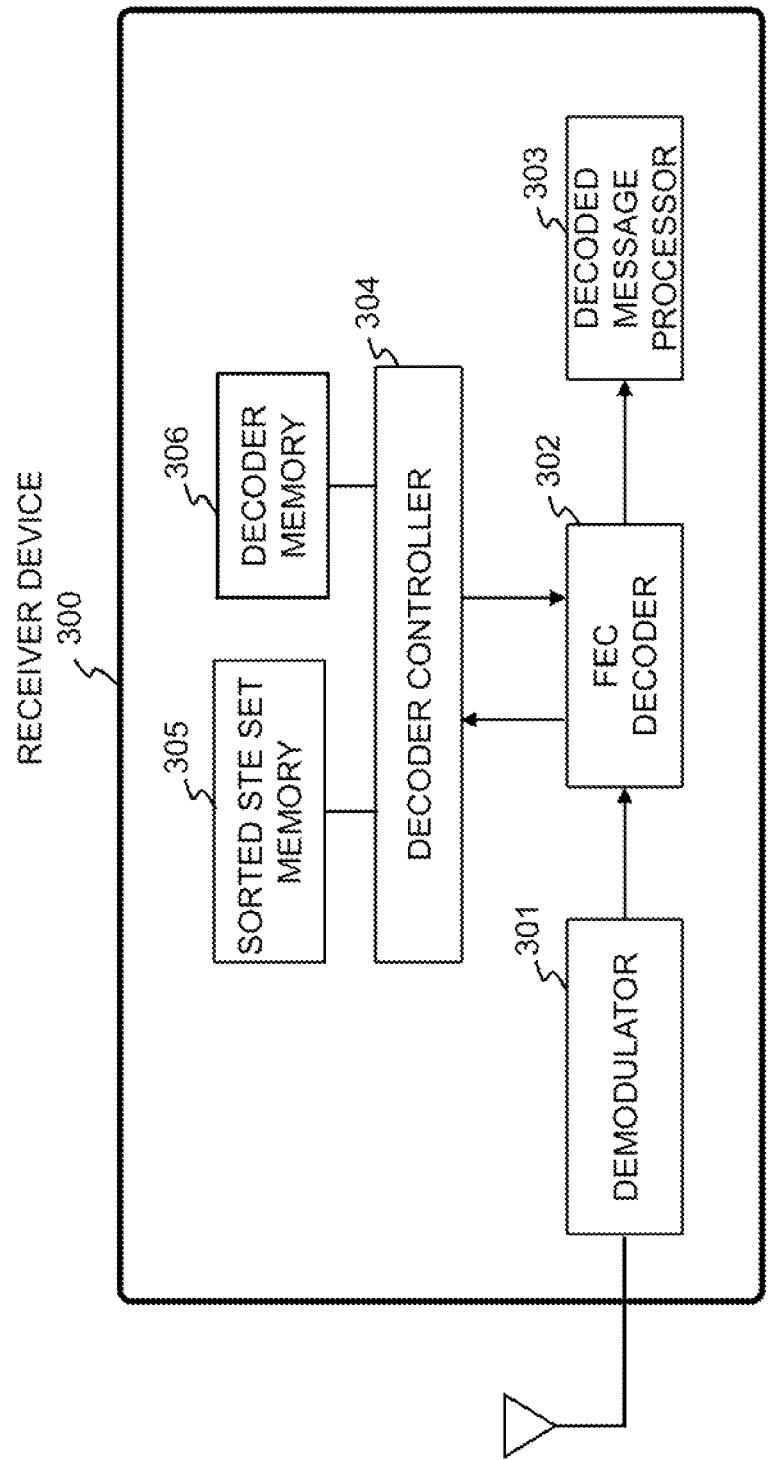
FIG. 11 is a schematic diagram illustrating a functional configuration of a receiver device according to the exemplary embodiment of the present invention.

As illustrated in FIG. 11, a receiver device 300 is provided with data receiving functions including a demodulator 301, a FEC decoder 302, a decoded message processor 303 and a decoding block including a decoder controller 304, a sorted STE set memory 305 and a decoder memory 306. The decoder controller 304 performs a check in each partition to verify if the partition has been decoded correctly. The check is performed using the checksum function employed at the sender device 100. The FEC decoder 302, the decoded message processor 303 and the decoder controller 304 may be implemented on a processor running respective programs stored in a memory device (not shown).

LLRs of the received vector are computed and then are used as input to the decoding algorithm inside the FEC decoder 302. The FEC decoder 302 runs a decoding algorithm on the LLR vector to produce a decoded message, which is output to the decoded message processor 303. The decoder controller 304 takes the LLR of decoded bits at the STE indices after the initial decoding attempt and sorts them based on the absolute value of LLR. Furthermore, the decoder controller 303 also performs the check-bit computation in each partition which will be described later.

2.2) Recurrent Decoding Operation

<Determining Location of Decoding Error>

Figure 12:
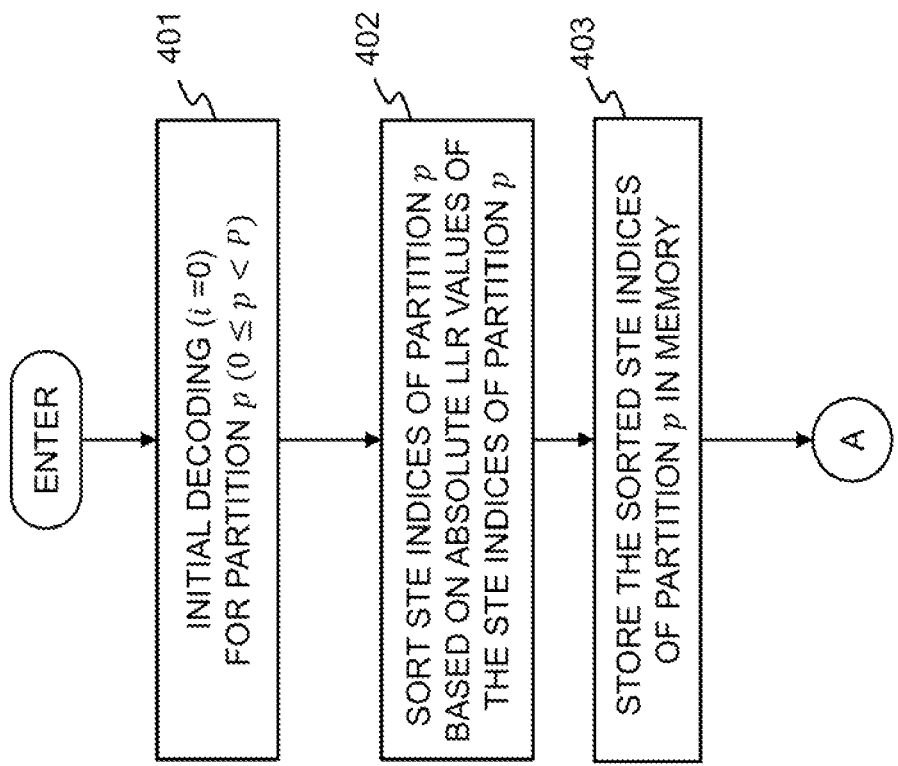
FIG. 12 is a flowchart illustrating an operation to determine the order in which bit inversion is performed in each partition, according to the exemplary embodiment of the present invention.

Referring to FIG. 12, pre-processing to determine the location of decoding error according to an exemplary embodiment of the present invention is described. When the FEC decoder 302 performs the initial decoding attempt in partition p (operation 401), the absolute LLR values of the STE indices are sent to the decoder controller 304. The decoder controller 304 performs the sorting of the absolute LLR values of the STE indices (operation 402). The STE indices of the partition p are thus sorted and stored in the sorted STE set memory 305 (operation 403). Then, the decoder controller 304 proceeds to the processing of recurrent decoding iteration.

First Example

Figure 13:
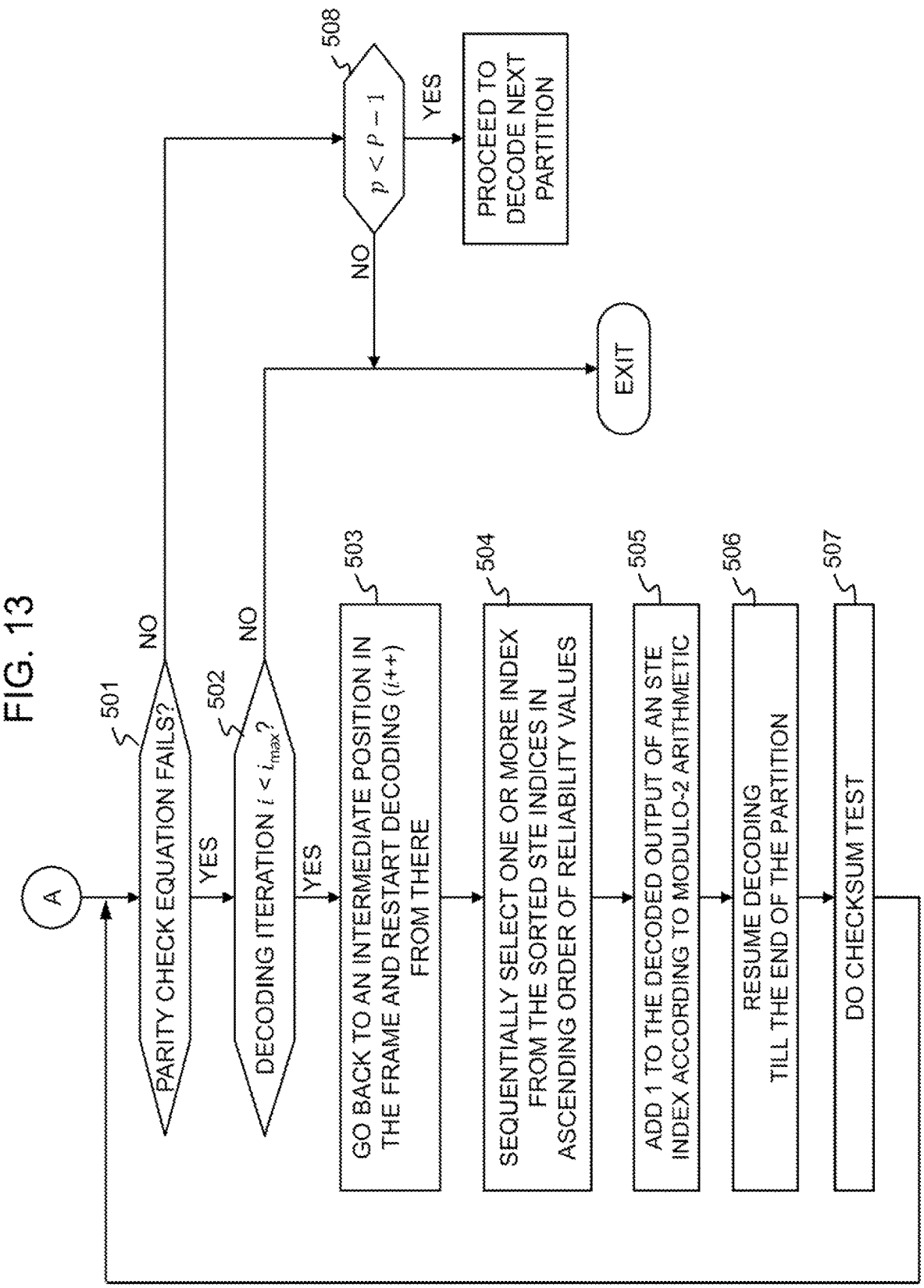
FIG. 13 is a block diagram illustrating a first example of bit-inversion operation in the receiver device shown in FIG. 11.

Referring to FIG. 13, a first example of a recurring decoding attempt is described. Assume there are P partitions in the frame. The decoder controller 304 computes the parity check equation in partition p ($0 =< p < P$) and checks whether the parity check equation fails or not (operation 501). When a parity check equation fails in partition p (YES in operation 501), then the decoder controller 304 checks whether the decoding iteration i is smaller than the predetermined threshold $i_{max}$ (operation 502). If $i < i_{max}$ (YES in operation 502), the decoder controller 304 instructs the FEC decoder 302 to restart from an intermediate position in the frame and the decoding iteration i is incremented by one (operation 503).

In this example, it is assumed that the intermediate decoding states (partial sum and LLR) are saved in memory after each partition, when it is verified that partition has been correctly decoded. Details on the intermediate decoding states (partial sum and LLR) will be described with reference to FIG. 20. Since the FEC decoder 302 is currently decoding the p-th partition, that means the FEC decoder has confirmed correct decoding till (p−1)th partition. Thus the intermediate decoding states after (p−1)th partition is stored in the decoder memory 306. Once a decoding attempt in partition p fails, the FEC decoder 302 goes back to the first bit of partition p, copies the stored values of intermediate decoding states at the end of partition p−1, and resumes decoding from there (operation 503). Thus, by starting the decoding iteration at intermediate position of the frame, it is possible to skip the unnecessary decoding of all bits from the start of the frame in a recurrent decoding attempt. In another example, the intermediate decoding states of the decoder are saved right before the first STE index of a partition. Thus, a recurrent decoding attempt can be directly started from the first STE index of that partition.

In the recurrent decoding attempt, one or more index is sequentially selected from the sorted STE indices in ascending order of confidence values (operation 504) and a decoded bit at the selected index is inverted by adding 1 to the decoded bit using modulo-2 arithmetic (operation 505) and then the decoding is resumed till the end of the partition p (operation 506). Thereafter, the decoder controller 304 performs the checksum test (operation 507) before going back to the operation 501.

When the checksum equation is satisfied (NO in operation 501), it is checked whether the present partition p has not reached the final partition (p<P−1) (operation 508). When p<P−1 (YES in operation 508), the processing proceeds to the above-mentioned operations 401-403 and 501-508 for the next partition (p+1). When the present partition p is the final partition (NO in operation 508) or when the decoding iteration i is equal to $i_{max}$ (No in operation 502), the processing terminates.

Figure 14:
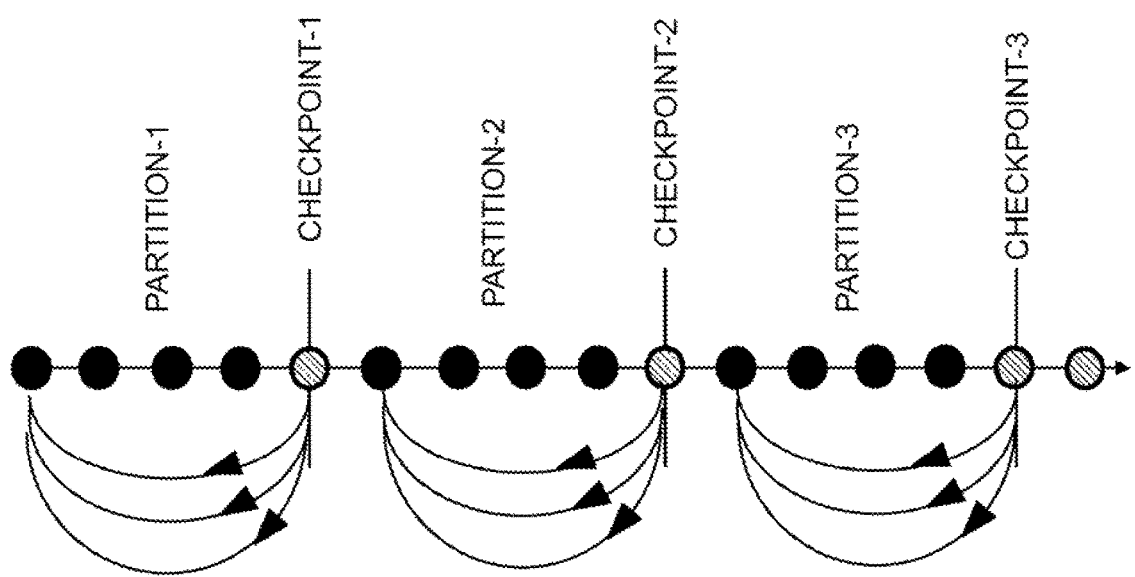
FIG. 14 is a schematic diagram illustrating a decoding sequence in the case of FIG. 13.

As schematically illustrated in FIG. 14, the recurrent decoding attempt with bit-inversion as mentioned above is repeated for each partition.

The bit-inversion (operation 505) may simply refer to replacing a 0 by 1 and vice-versa. As described before, the bit-inversion operation is performed based on the following conditions:

(1) It is only performed during a recurrent decoding attempt, not in the initial decoding attempt.
(2) It is performed on the STE indices, sorted in ascending order of their absolute LLR values. That means, in the first recurrent decoding attempt, the first index of the sorted STE set in that partition may be subjected to bit-inversion operation.
(3) Consider an exemplary sorted STE set is {s,t,u,v}, in a given partition. Index s is assumed to have the lowest confidence value for the decoded estimate, and index v is assumed to have the highest confidence value for the decoded estimate. Here, confidence value can be manifested in absolute LLR value or some other parameter. When the initial decoding attempt ends in a decoding failure, the index s is subjected to bit-inversion operation in the first recurrent decoding attempt. All the other bits are decoded as usual till the end of the partition (operation 506). If a decoding failure is detected by parity check equation (YES in operation 501) and $i<i_{max}$ (YES in operation 502), a second recurrent decoding attempt may be initiated, subject to satisfying other conditions as discussed earlier. In the second decoding attempt, the decoded bit at the selected STE index t is subject to bit-inversion operation and so on.
(4) In some embodiments, it is possible that two or more indices are subjected to bit-inversion operation in the same recurrent decoding attempt.

Second Example

Figure 15:
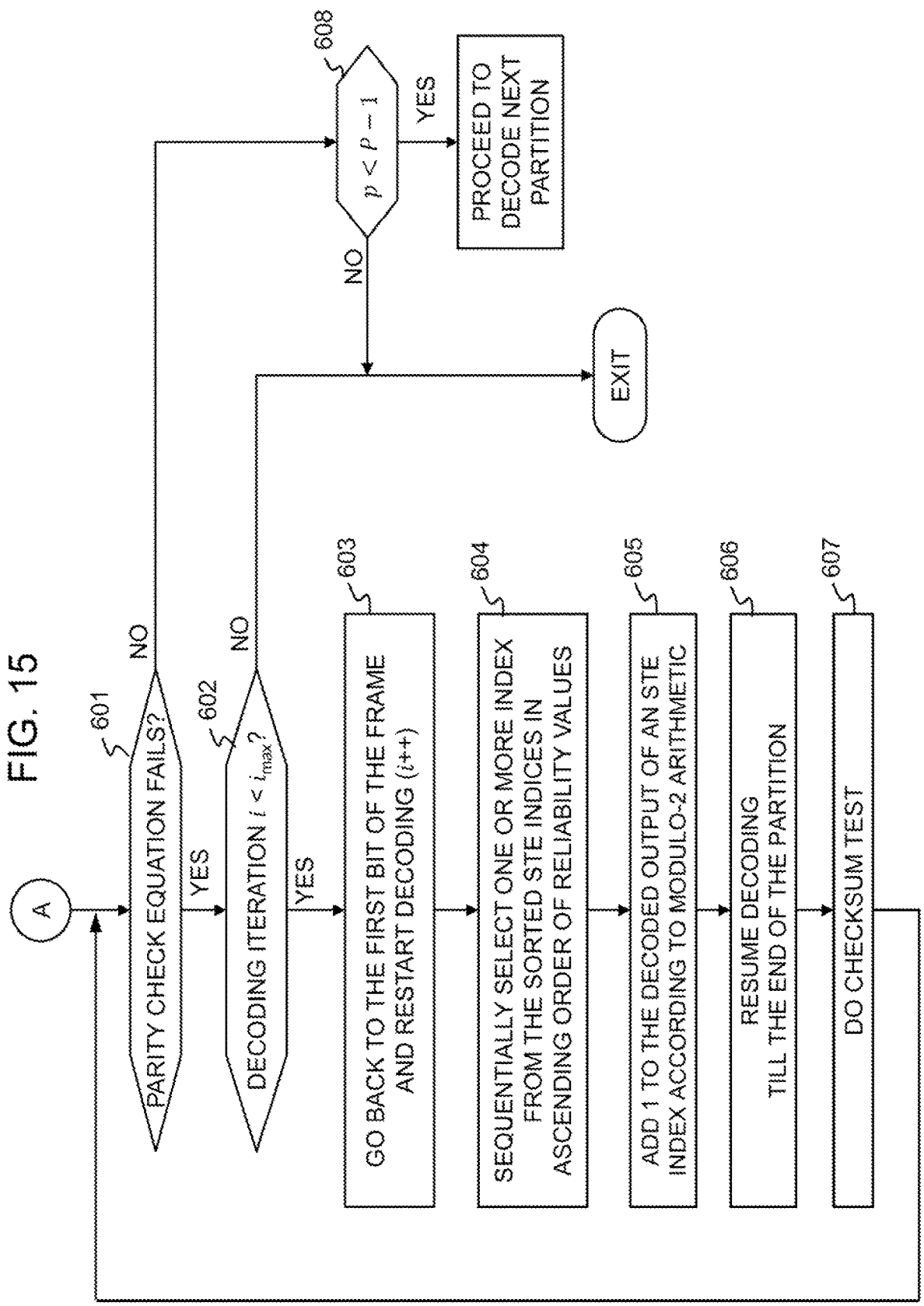
FIG. 15 is a block diagram illustrating a second example of bit-inversion operation in the receiver device shown in FIG. 11.

Referring to FIG. 15, a second example of a recurring decoding attempt is described. In this example, it is assumed that the intermediate decoding states (partial sum and LLR) are not saved in memory after each partition. Thus, if an initial decoding attempt results in failure (YES in operation 601) and $i<i_{max}$ (YES in operation 502), then the recurrent decoding attempt is re-initiated from the start of the frame (operation 603), instead of the start of the partition. Note that the other operations 604-608 are similar to the operations 504-508 shown in FIG. 13.

Figure 16:
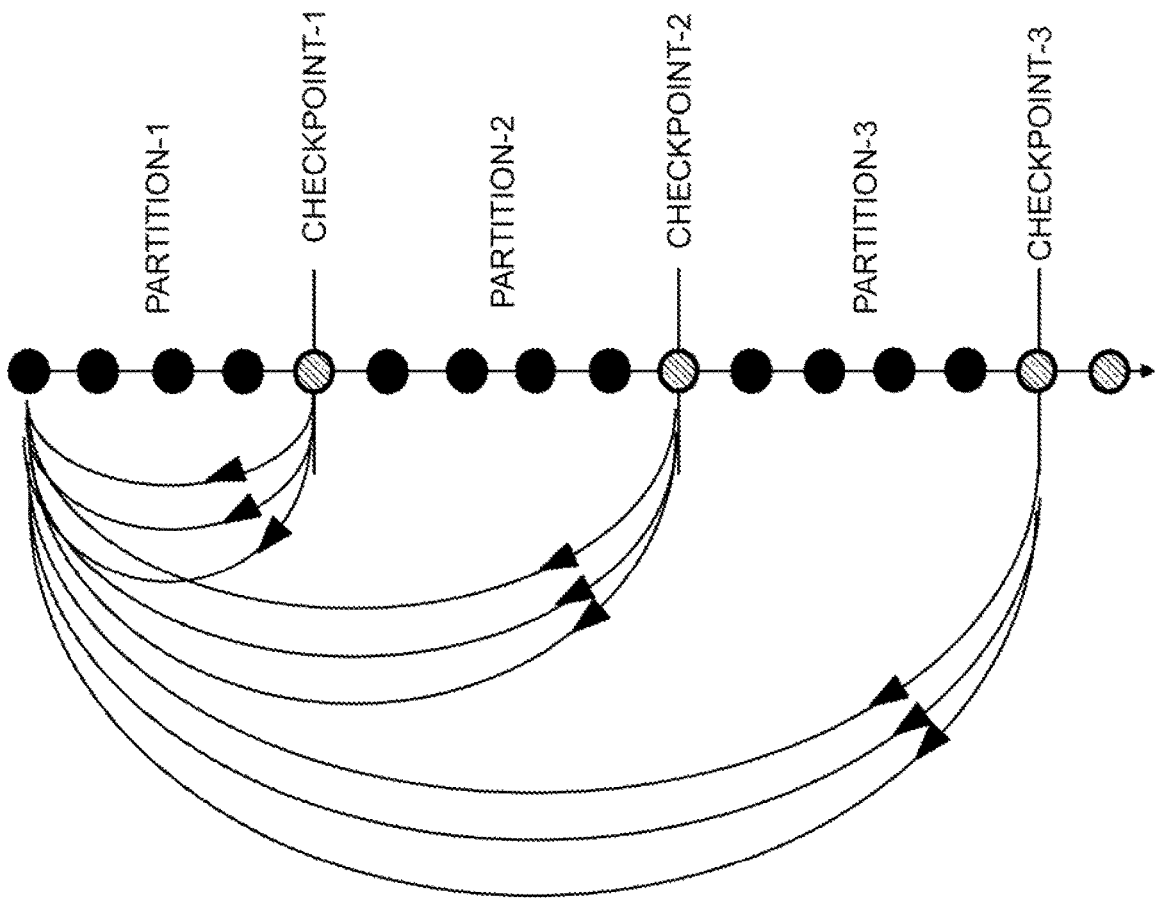
FIG. 16 is a schematic diagram illustrating a decoding sequence in the case of FIG. 15.

As illustrated in FIG. 16, the second example of recurrent decoding attempt with bit-inversion as mentioned above is repeated from the start of the frame. The benefit of this method is that there is no requirement of additional memory to store the intermediate decoding states after a partition. Thus, the requirement of additional memory is traded with additional computation of all the previous partitions.

3. EXAMPLES 3.1) First Example

Figure 17:
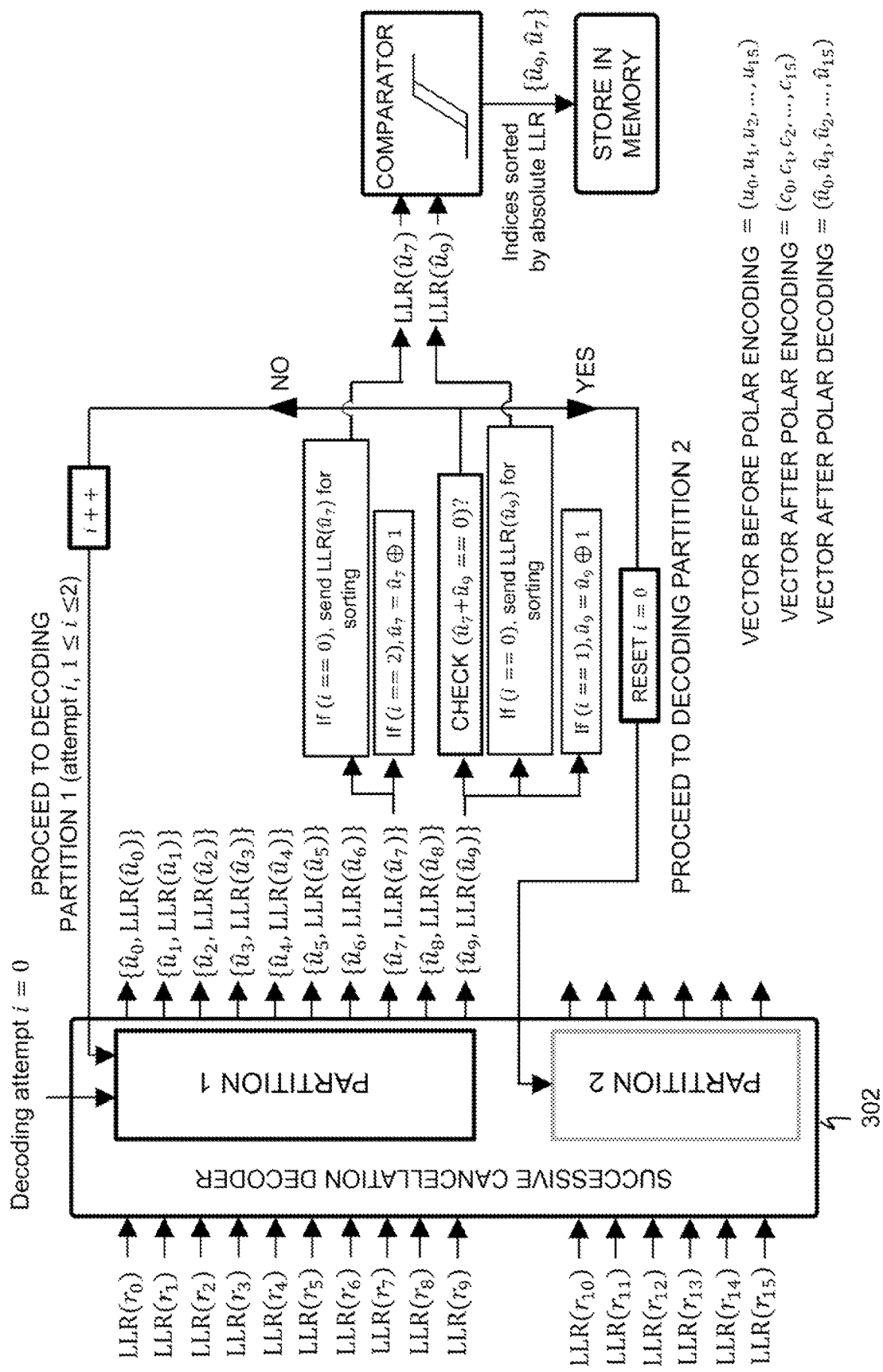
FIG. 17 is a schematic diagram showing an illustrative example of decoding operations for partition 1 according to the example of the present invention.
Figure 18:
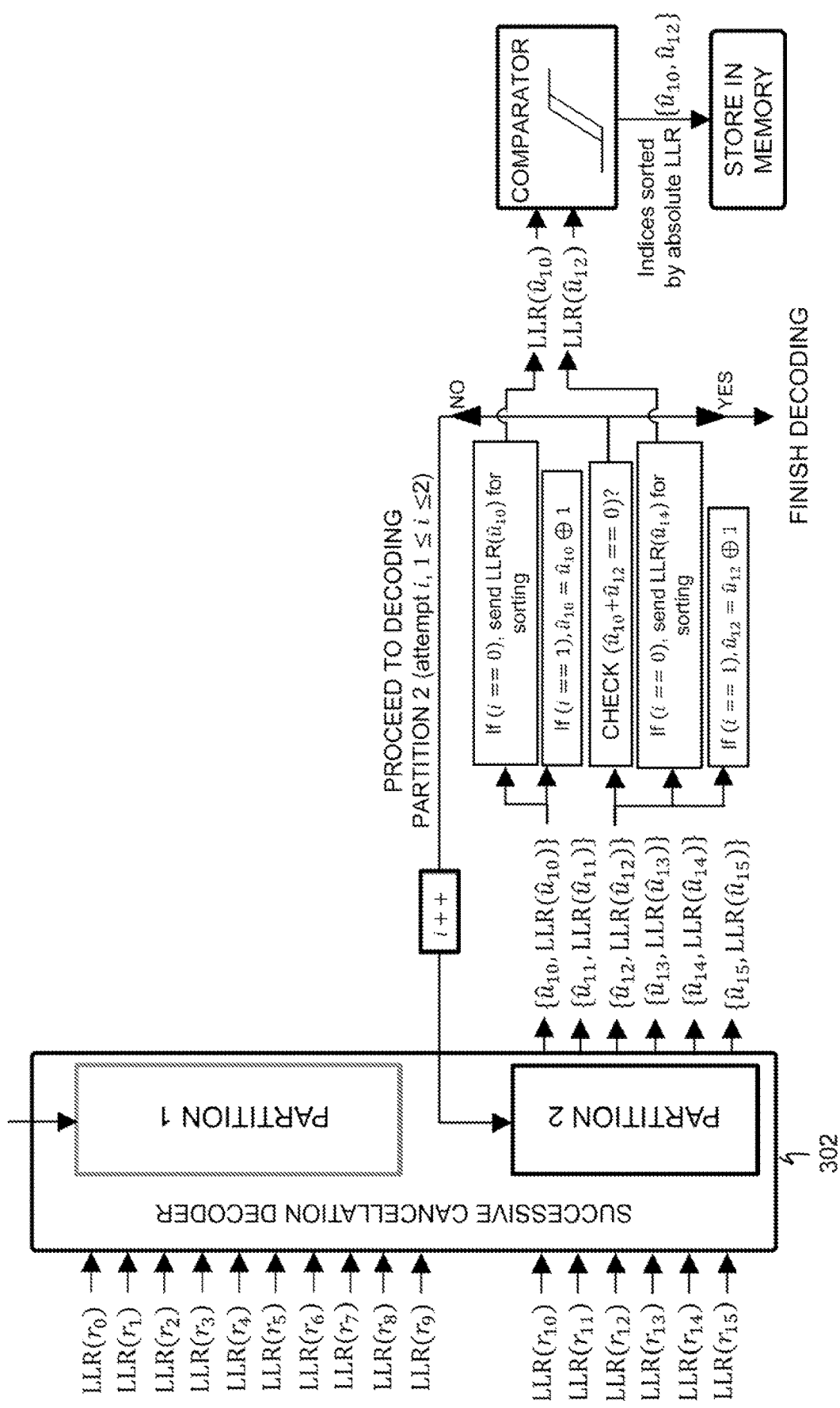
FIG. 18 is a schematic diagram showing an illustrative example of decoding operations for partition 2 following the decoding operations for the partition 1 of FIG. 17.

FIGS. 17 and 18 are illustration of a decoder according to a first example of the decoder according to the present disclosure. Hereinafter, an output $\hat{u}$ of a SC decoder also denotes $$\hat{u} \quad \text{(Math. 3)}$$

in FIGS. 17, 18, 20, 22 and 23.

Referring to FIG. 17, a polar code of length 16 is considered which is divided into two partitions. The decoder 302 employs a successive cancellation decoding algorithm. The decoder 302 inputs the LLRs of the channel outputs ($LLR(r_0)$, $LLR(r_1)$, ..., $LLR(r_{15})$). The decoder 302 starts an initial decoding attempt (indicated by i=0) of partition 1. As a result, two-tuple outputs are obtained corresponding to each of the eight decoded bits in the partition 1. This two-tuple consists of decoded estimate $\hat{u}$ and LLR. Consider that the STE set for the polar code in this example is {7, 9, 10, 12}, as explained earlier using FIGS. 4 and 5. Consider that the frame is divided into two partitions, such that each partition contains two STE indices. Thus, the partitioning rule used here assumes equal distribution of STE indices in each partition. There can be other rules used for partitioning too.

In the present example, let us consider that partition 1 contains the first 10 bits, and partition 2 contains the last 6 bits as illustrated in FIG. 4. The STE set for first partition is {7,9}, and the STE set for second partition is {10,12}. Let us consider an exemplary precoding technique used at the encoder that copies bit $u_7$ to $u_9$, before doing polar encoding. This precoding technique basically enables the decoder controller 304 to check if the partition 1 has been decoded without error. Applying the same precoding technique in partition 2, bit $u_{10}$ may be copied to $u_{12}$. This enables the decoder controller 304 to verify if partition 2 has been decoded correctly. The pre-processing controller 104 of the sender device 100 may perform this precoding operation. Thus, the pre-coded vector ($u_0$, $u_1$, $u_2$, ..., $u_{15}$) may be obtained, which is then subjected to polar encoding by the FEC encoder 102. The resulting polar codeword is ($c_0$, $c_1$, $c_2$, ..., $c_{15}$) which may be suitably modulated and transmitted over a communication channel.

It is assumed that the receiver device 300 receives a vector ($r_0$, $r_1$, $r_2$, ..., $r_{15}$). At the receiver device 300, the FEC decoder 302 may compute the LLR of the received vector and feed it as input to an SC decoding algorithm. Thus, the absolute values of LLR of decoded bits from the set of indices {7,9} are sent to a comparator for sorting operation, implemented in the decoder controller 304, after the initial decoding attempt (i=0) in partition 1. Let us assume that they are sorted as {9,7}. Once the bit $\hat{u}_9$ has been decoded in the attempt i=0, a test is performed to check if $\hat{u}_7 + \hat{u}_9 == 0$. If the equation is satisfied (YES), then the decoder proceeds to decoding partition 2. In case the equation is not satisfied (NO), then the decoder 302 starts a recurrent decoding attempt (i=1) from the start of partition 1. In the recurrent decoding attempt i=1, the decoder 302 decodes same as before till $\hat{u}_8$. Once it decodes $\hat{u}_9$, it inverts the decoded bit $\hat{u}_9$. The checksum equation $\hat{u}_7 + \hat{u}_9 == 0$ is tested again after the recurrent decoding attempt i=1. If it is satisfied (YES), the decoder 302 proceeds to decode the partition 2. If the checksum equation is not satisfied (NO), the decoder 302 starts a recurrent decoding attempt (i=2) from the start of partition 1. In the recurrent decoding attempt i=2, the decoder 302 decodes same as before till $\hat{u}_6$. Once it decodes $\hat{u}_7$, it inverts the decoded bit $\hat{u}_7$. The rest of the decoding in partition 1 is performed as usual and the checksum equation $\hat{u}_7 + \hat{u}_9 == 0$ is tested. If the checksum equation fails at the end of partition 1 after recurrent decoding attempt i=2, the decoder may terminate the decoding process and discard the frame.

Referring to FIG. 18, an illustration of exemplary embodiment is shown, in continuation of the example in FIG. 17. Assuming that partition 1 has been correctly decoded, the decoding attempt i is reset to 0. The decoder 302 now proceeds to decode partition 2. The absolute LLR values of the STE indices {10, 12} of partition 2 are sent to a comparator for sorting operation, implemented in the decoder controller 304, after the initial decoding attempt (i=0) at these indices. Let us assume that they are sorted as {10, 12}. Once the bit $\hat{u}_{15}$ has been decoded in the attempt i=0, a test may be performed to check if $\hat{u}_{10}+\hat{u}_{12}==0$. If the equation is satisfied (YES), then the decoder 302 ends the decoding of the frame. In case the equation is not satisfied (NO), then the decoder 302 starts a recurrent decoding attempt (i=1) from the start of partition 2. In the recurrent decoding attempt i=1, the decoder 302 decodes same as before till $\hat{u}_9$. Once it decodes $\hat{u}_{10}$, it inverts the decoded bit $\hat{u}_{10}$. The rest of the decoding in partition 2 is performed as usual. The checksum equation $\hat{u}_{10}+\hat{u}_{12}==0$ is tested again after decoding the bit $\hat{u}_{12}$ in the recurrent decoding attempt i=1. If it is satisfied (YES), the decoding process ends. If the checksum equation is not satisfied (NO), the decoder starts a recurrent decoding attempt (i=2) from the start of partition 2. In the recurrent decoding attempt i=2, the decoder 302 decodes same as before till $\hat{u}_{11}$. Once it decodes $\hat{u}_{12}$, it inverts the decoded bit $\hat{u}_{12}$. Subsequently, the checksum equation $\hat{u}_{10}+\hat{u}_{12}==0$ is tested. If the checksum equation fails after recurrent decoding attempt i=3, the decoder 302 may terminate the decoding process and discard the frame.

3.2) Second Example Using CRC Code

According to the embodiment of the present disclosure, it is possible that the pre-processing controller 104 of the sender device 100 encodes the bits at the STE indices of a frame or partition by a CRC code. For example, if the size of STE set in a given partition is X, then an R bit CRC code can be used in that partition to encode the information at X-R number of STE indices and the resulting R bit CRC can be stored in the remaining R number of STE indices. According to another example, it may be possible to encode the information bits at all X number of STE indices if a given partition by a CRC code of length R, and the R bit CRC are placed in non-STE indices of that partition. The precoded vector thus obtained may be further encoded by the FEC encoder 102 using polar codes. At the decoder, once all the STE indices and CRC bits in that partition have been decoded, it is possible to do a CRC check. If the check fails, then the decoder can be re-initiated from the start of the frame or that partition, for recurrent decoding attempts as explained before. In each recurrent decoding attempt, at least one decoded bit at an STE set may be inverted. By restricting the CRC precoding only to STE indices instead of all non-frozen indices of a partition, it may be possible to reduce the number of CRC bits needed for efficient detection of decoding error in a partition. This may reduce the CRC overhead, as well as reduce computations. By reducing CRC overhead, it may be possible to transmit more information bits in each partition.

3.3) Third Example Using Interleaved CRC Code

In another example, it is possible to use a single CRC polynomial for the entire frame. In this method, it is possible to interleave the CRC bits in the frame such that each partition contains at least one CRC bit. In one exemplary method, the CRC bits are interleaved such that the CRC bits in each frame can be computed from the STE indices of that partition. In some other method, CRC bit of a given partition may be computed using the STE indices of that partition or one or more previous partitions. Interleaving the CRC bits can be done using a parity check matrix of chosen CRC polynomial. The message bits generated from a message source may be first encoded by a CRC encoder to produce a CRC codeword. A parity check matrix H may be computed as follows. Let g(x) denotes a CRC polynomial of degree C. Let M denote the period of the generator polynomial which may be defined as the least positive integer such that g(x) divides $x^M-1$. Compute period M of the CRC polynomial g(x). A method to find the period M may fill the coefficients of the C+1 terms of g(x) in a shift register and do circular shift operation on the shift register till the initial array reappears. The number of shift operations may be counted as the period of g(x). Let h(x) denote a parity-check polynomial of the CRC. Then h(x) may be obtained as $h(x)=(x^M+1)/g(x)$. The last row of H matrix may be obtained from the coefficients of the last K+C terms of h(x). Then each of the above rows of H matrix starting from the second last row to the first row may be obtained by one left shift operation of the previous row. For instance, the second last row may be obtained by one left shift of the last row; the first row may be obtained by the C-1 left shifts of the last row and so on. In this way, a parity check matrix H for the CRC code may be obtained.

Next, a method to generate an interleaver using H matrix is discussed. If d CRC bits are desired to be interleaved, then some column operation may be performed on the first d rows of H. Such column operations may be done as follows: In the first row, all columns that have a value 1 may be pushed to the leftmost positions of the H matrix. Meaning, after the column permutation operation at the first row, the first row may have consecutive 1s at the beginning, followed by consecutive 0s till the end. In the second row, all those columns that have value 1 in the second row but value 0 in the first row may be pushed to consecutive positions right after the column that has the last 1 in first row. Similarly, in the third row, all those columns that have value 1 in the third row but value 0 in first and second row may be pushed to consecutive positions right after the column that has the last 1 in second row. By performing such column permutations on the first d rows of H matrix and storing the column indices post-permutation, it is possible to obtain an interleaving pattern. After this, the indices of remaining columns of H that are left un-permuted, if any, may be stored in their natural order at the end of interleaver 1. Thus, an interleaving pattern for CRC codeword may be obtained. There can be many variants of this method where the columns of H matrix are not necessarily pushed to the extreme left. Instead, the columns may be pushed by some positions to the left, not the maximum extent possible. Many such rearrangements of the columns can be done to generate a more appropriate interleaving pattern.

3.4) Fourth Example for SCL Decoder

The method described using the above-mentioned embodiments may be used with an SC or SCL decoder. For SCL decoder, the method of recurrent decoding attempts and bit-inversion may be applied to one or more of the surviving decoding paths.

In the above-described embodiments and examples of the present invention, codeword of a polar code of length N may be constructed by multiplying u with the bit-reversal permutation matrix B and the (N×N) generator matrix as follows:

$$c = uBG_2^{\otimes 4}. \quad \text{(Math. 4)}$$

The codeword c is transmitted over a communication channel.

The log-likelihood ratio (LLR) value corresponding to a decoding estimate ^u; may be represented using the following equation:

$$L_N^{(i)}(y_0^{N-1}, u_0^{i-1}) = \ln \frac{W_N^{(i)}(y_0^{N-1}, u_0^{i-1} | u_i = 0)}{W_N^{(i)}(y_0^{N-1}, u_0^{i-1} | u_i = 1)} = \lambda, \quad \text{(Math. 5)}$$

where $$W_N^{(i)}(y_0^{N-1}, u_0^{i-1} | u_i) \quad \text{(Math. 6)}$$

is the transition probability of the $i^{th}$ subchannel, $y_0^{N-1}$ is the channel output of length N and $u_0^{i-1}$ is the already decoded bit sequence $u_0$ to $u_{i-1}$.

The above-described exemplary embodiments and examples of the present invention may be implemented on a processor running programs stored in a memory.

4. ANOTHER EXEMPLARY EMBODIMENT

Figure 19:
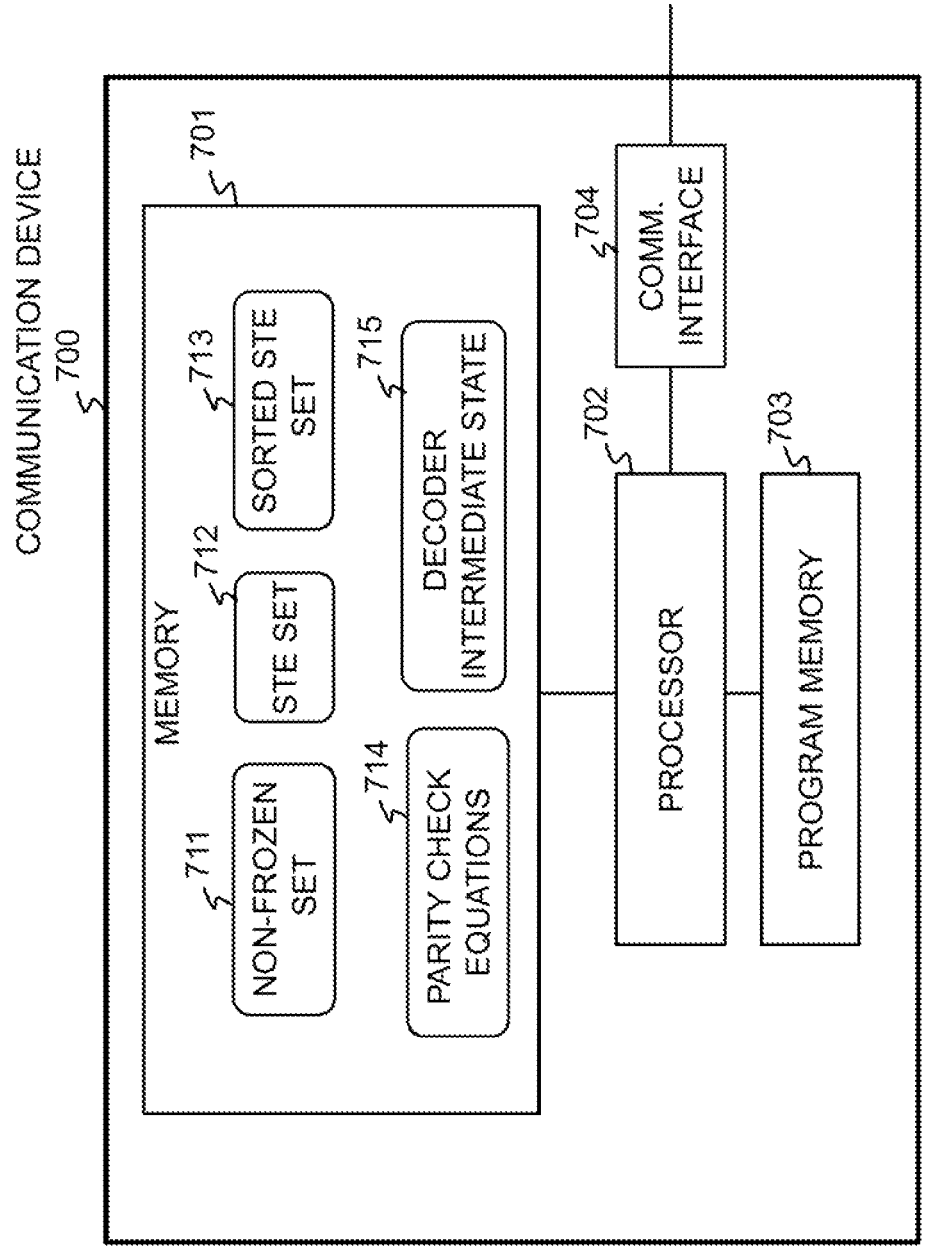
FIG. 19 is a block diagram illustrating an architecture of a communication device according to the exemplary embodiment of the present invention.

As illustrated in FIG. 19, a communication device 700 may be provided with at least the sender device 100 as shown in FIG. 9, including the function of selecting STE indices, frame partitioning, parity check equations for detection of decoding failure in each partition, as described above. The communication device 700 includes a memory 701, a processor 702, a program memory 703, a communication interface 704, and other units necessary for communication. The memory 701 further consists of memory to store at least a non-frozen set 711, an STE set 712, a sorted STE set 713, parity check equations 714, decoder intermediate state 715. The program memory 703 may store computer-readable programs for implementing at least the pre-processing controller 104 and the FEC encoder 102 as shown in FIG. 9. According to the programs stored in the program memory 703, the processor 702 uses the non-frozen set 711 and STE set 712 in the memory 701 to perform construction of check bits according to the check bit equations stored in the parity check equations 714 as described above. During recurrent decoding attempts, bit-inversion operation is performed on the indices from the sorted STE set 712. In the embodiment where recurrent decoding attempts are initiated from the start of the current partition, the decoder intermediate state 715 at the end of the previous partition may be stored in the memory 701.

Decoder intermediate state may be understood as the partial sum and LLR values at one or more nodes out of the $N*\log_2(N)$ nodes in a decoding graph of successive cancellation decoding, where N is length of polar code.

Figure 20:
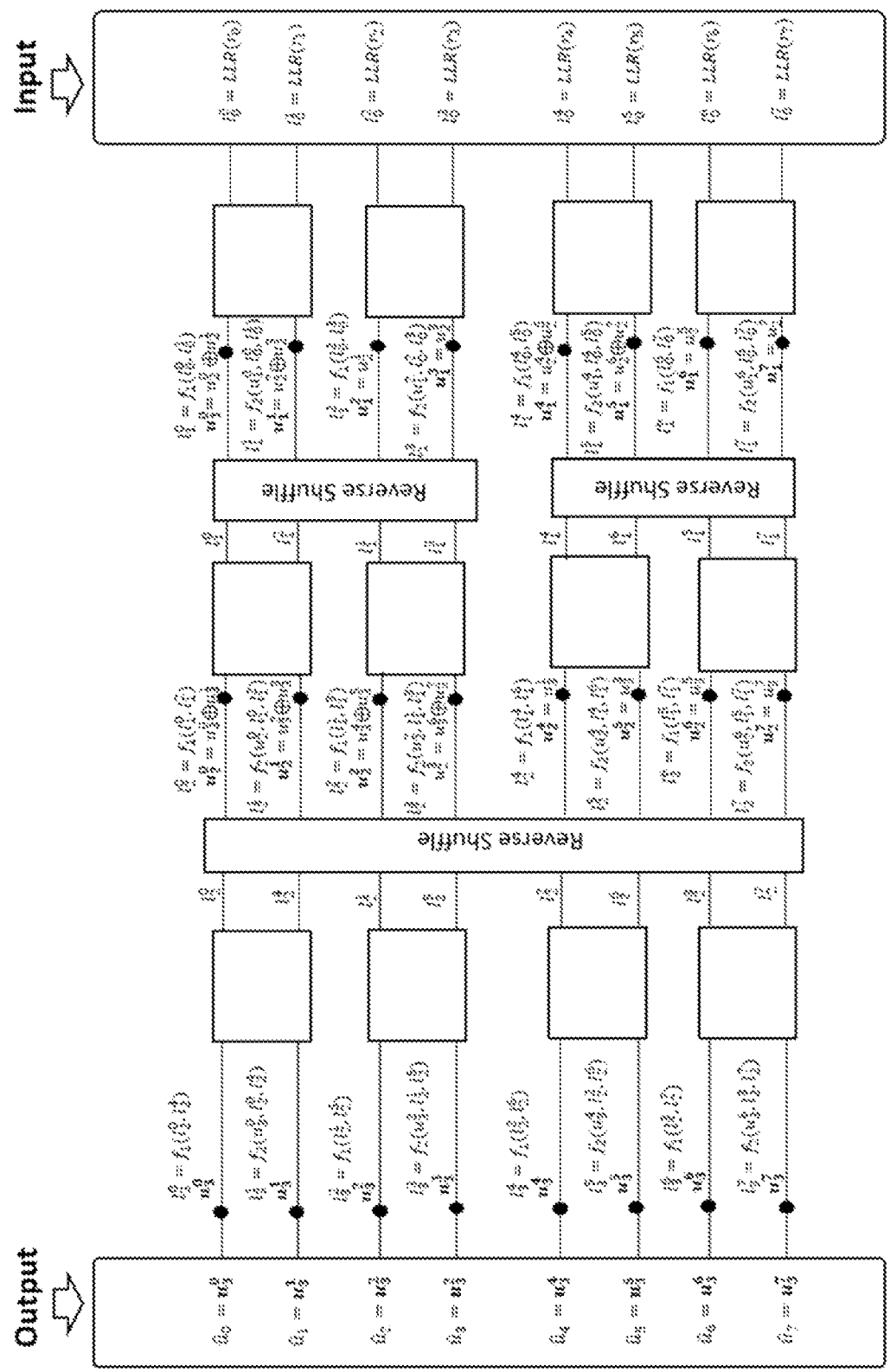
FIG. 20 is a block diagram illustrating an architecture of a successive cancellation decoder according to the exemplary embodiment of the present invention.

With reference to FIG. 20, an illustrative example of decoding graph in a successive cancellation decoding algorithm is shown. FIG. 20 shows the decoding of a polar code of length N=8. The LLRs of the channel output $LLR(r_0)$, $LLR(r_1)$, ..., $LLR(r_7)$ are fed as input to the extreme right side of the graph. The graph may compute a two-tuple (LLR, partial sum) at each of the $N*\log_2(N)=8*\log_2(8)=24$ nodes (shown as solid black circles). The decoded estimates (^$u_0$, ^$u_1$, ..., ^$u_7$) are obtained at the extreme left side of the graph as output. Consider an exemplary case, where a polar code of length N=7 is divided into two partitions such that a first partition consists of ($u_0$, $u_1$, $u_2$, $u_3$) and a second partition consists of ($u_4$, $u_5$, $u_6$, $u_7$). When a decoder correctly decode the first partition, it may be possible to store the computed values LLR and partial sum of the nodes in the decoding graph that have been computed till the decoding of last bit of first partition, i.e. ^$u_3$, Then the decoder may proceed to decode the second partition. If a decoding error happens in the second partition, the decoder may simply load the stored values of the first partition and initiate recurrent decoding attempt only in the second partition. This eliminates the necessity of decoding the first partition repeatedly in each recurrent decoding attempt. Thus, complexity may be reduced.

Partial sum and LLR values at intermediate state of the decoding graph may be stored as a decoder intermediate state 715 in the memory 701. For example, by storing such intermediate states after each partition, it is possible to initiate a recurrent decoding attempt just from start of the current partition as the previous values of intermediate state can be readily obtained from the memory. The helps to reduce the total number of computations in a recurrent decoding attempt as the recurrent decoding attempt can be solely restricted to the current partition. Note that, the decoder intermediate state 715 of the memory 701 may just store at most $N*\log_2(N)$ partial sum and an equal number of LLR values. The memory can be updated with the latest values of partial sum and LLR values once a partition has been successfully decoded.

The intermediate state of the decoding graph does not have to be necessarily stored in the memory after the end of a partition. In some embodiments, the index position at which the intermediate state of the decoding graph is updated in the memory may not be related to the partition boundary. It can be any other appropriate place that can reduce computation during a recurrent decoding attempt. For example, an intermediate state of the decoding graph could be the stored at the previous bit of the first STE index of a partition. By employing such technique, a recurrent decoding attempt can directly start from the STE index of a partition. Also, in some other embodiments, the intermediate state of the decoding graph may be updated in the memory as many times as one may want. It should be possible for a person skilled in the art to use other variants of such appropriate position. All such techniques should be construed to be in the scope of the present disclosure.

Figure 21:
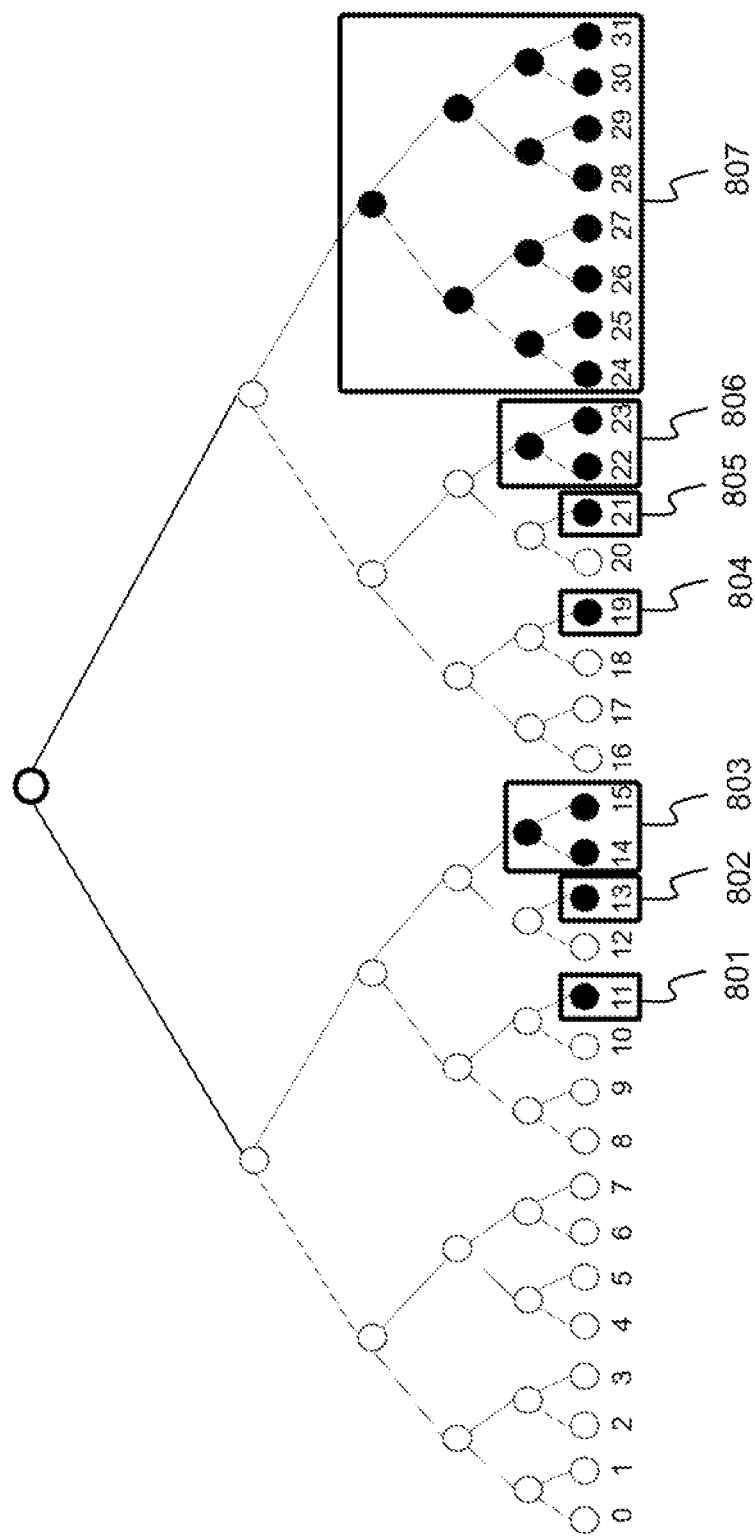
FIG. 21 is a tree diagram of polar codes showing another example for construction of STE set of indices.

With reference to FIG. 21, a second example of obtaining STE set for a polar code of length 32 is introduced. The subtrees are identified as reference numerals 801, 802, 803, 804, 805, 806 and 807. A STE set is formed consisting of the indices {11, 13, 14, 19, 21, 22, 24}.

Figure 22:
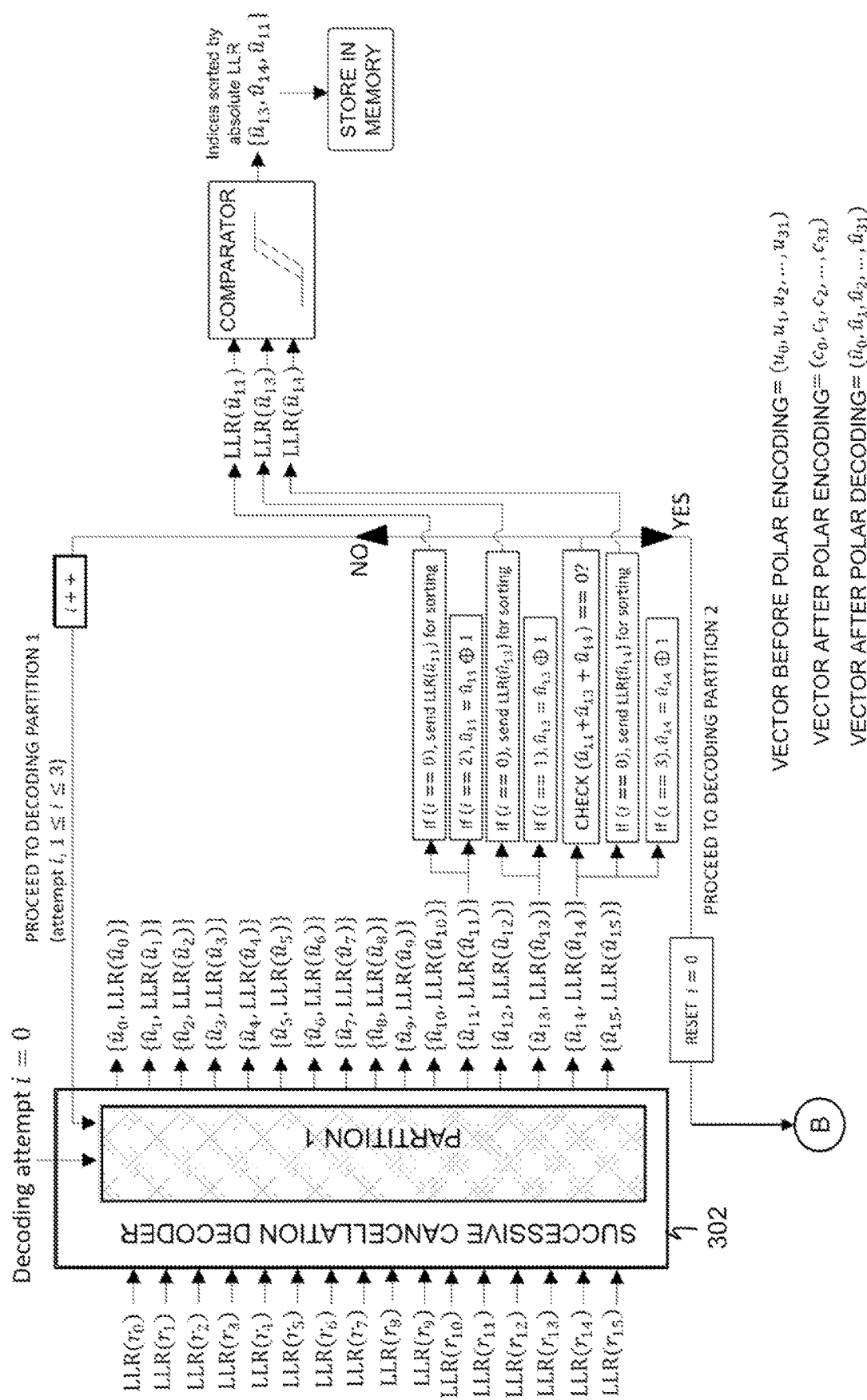
FIG. 22 is a schematic diagram showing an illustrative example of decoding operations for partition 1 according to another example of the present invention.
Figure 23:
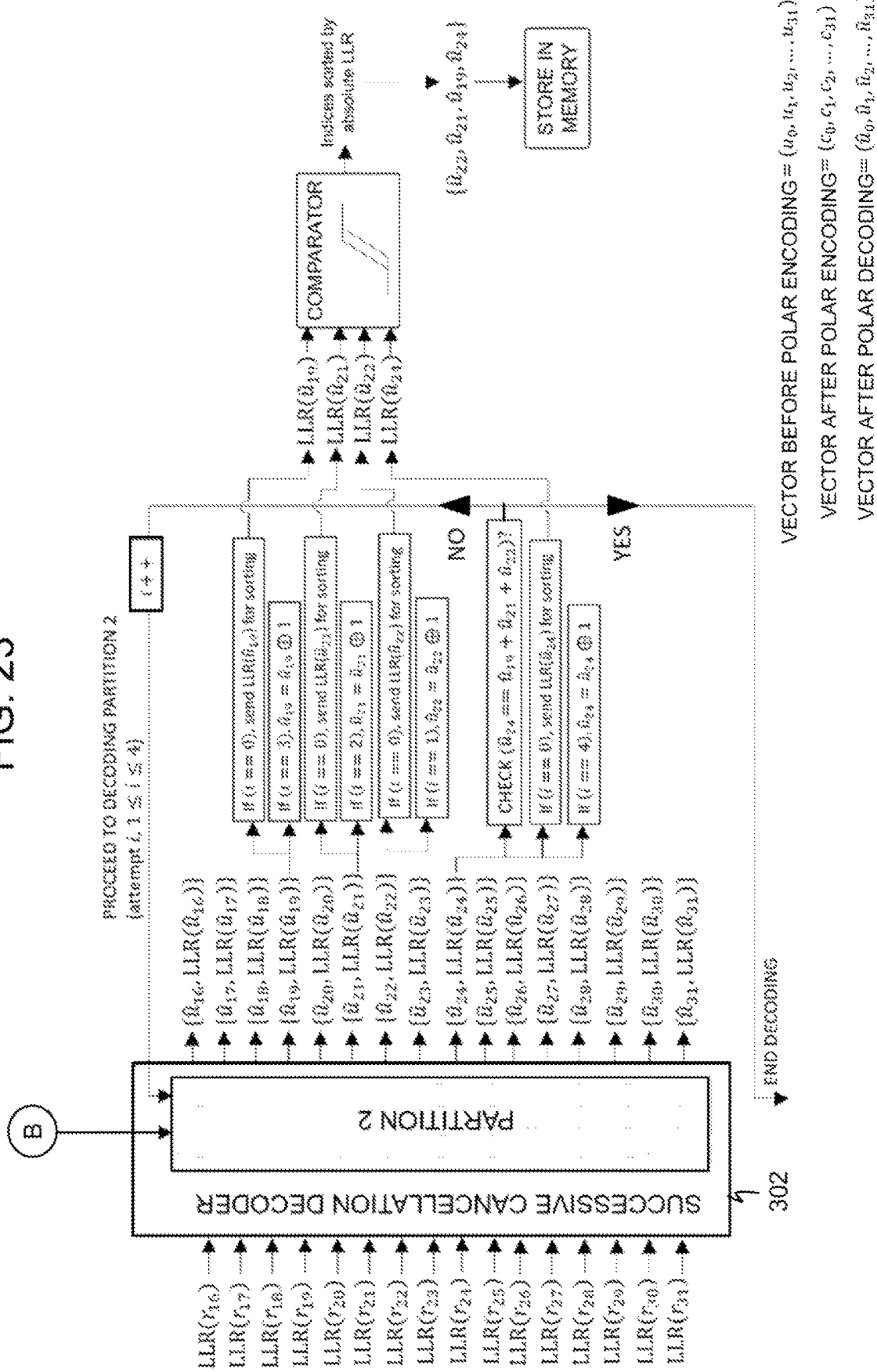
FIG. 23 is a schematic diagram showing an illustrative example of decoding operations for partition 2 following the decoding operations for the partition 1 of FIG. 22.

With reference to FIG. 22, a second example of the present invention is provided, using a polar code of length 32, and the STE set computed from FIG. 21. A frame is divided into two partitions: first partition consisting of indices ($u_0$, $u_1$, ..., $u_{15}$) and second partition consisting of indices ($u_{16}$, $u_{17}$, ..., $u_{31}$). The first partition includes three STE indices ($u_{11}$, $u_{13}$, $u_{14}$), and the second partition includes four STE indices ($u_{19}$, $u_{21}$, $u_{22}$, $u_{24}$). The first partition employs a parity equation $u_{14}=u_{11}+u_{13}$. The second partition employs a parity equation $u_{24}=u_{19}+u_{21}+u_{22}$. The STE indices in each partition are sorted by absolute LLR values during initial decoding attempt of that partition, and they are inverted in their sorted order (index with least absolute LLR goes first) during each recurrent decoding attempt of that partition. Note that, the pre-processing controller in the sender device precodes the information vector according to the parity check equations, and then the precoded vector is subjected to polar encoding.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the spirit of the present invention. In addition, where applicable, it is contemplated that software components may be implemented as hardware components, and vice-versa.

Although embodiments of the present disclosure have been described, these embodiments illustrate but do not limit the disclosure. For example, the frozen set may have any constant bit pattern (not restricting to the all-zero pattern) that is known to the decoder in advance. The generator matrix used in polar code encoding can be even of a form other than the n-time Kronecker product of $$G_2 = \begin{pmatrix} 1 & 0 \\ 1 & 1 \end{pmatrix}.$$ (Math. 7)

A different matrix may also be used as polarizing kernel. For example, the following matrix can be used as a different polarizing kernel:

$$G_2 = \begin{pmatrix} 1 & 0 & 0 \\ 1 & 1 & 0 \\ 1 & 0 & 1 \end{pmatrix}.$$ (Math. 8)

Check-bits may be of form other than parity-check or cyclic redundancy check bits. This disclosure does not limit the type of check function used to generate the check-bits. For instance, it can be any kind of parity check function using part or whole of the non-frozen set or frozen set. Reliability of indices may even be evaluated by metrics other than error probability or Bhattacharyya parameter. Bit-reversal permutation matrix B shown in Math. 4 may or may not be used for encoding.

Application software in accordance with the present disclosure, such as computer programs executed by the device and may be stored on one or more computer readable mediums. It is also contemplated that the steps identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

The above exemplary embodiments can be applied to communication systems employing polar encoding and decoding.

5. TECHNICAL TERMS

The afore-mentioned "communication device" (or "sender device" or receiver device") in the present disclosure is an entity connected to a network via a wireless interface.

It should be noted that the present disclosure is not limited to a dedicated communication device, and can be applied to any device having a communication function as explained in the following paragraphs.

The terms "communication device" (or "sender device" or receiver device") are generally intended to be synonymous with one another, and include standalone mobile stations, such as terminals, cell phones, smart phones, tablets, cellular IoT devices, IoT devices, and machinery. It will be appreciated that the terms "mobile station" and "mobile device" also encompass devices that remain stationary for a long period of time.

The afore-mentioned "communication device" ay, for example, be an item of equipment for production or manufacture and/or an item of energy related machinery (for example equipment or machinery such as: boilers; engines; turbines; solar panels; wind turbines; hydroelectric generators; thermal power generators; nuclear electricity generators; batteries; nuclear systems and/or associated equipment; heavy electrical machinery; pumps including vacuum pumps; compressors; fans; blowers; oil hydraulic equipment; pneumatic equipment; metal working machinery; manipulators; robots and/or their application systems; tools; molds or dies; rolls; conveying equipment; elevating equipment; materials handling equipment; textile machinery; sewing machines; printing and/or related machinery; paper converting machinery; chemical machinery; mining and/or construction machinery and/or related equipment; machinery and/or implements for agriculture, forestry and/or fisheries; safety and/or environment preservation equipment; tractors; precision bearings; chains; gears; power transmission equipment; lubricating equipment; valves; pipe fittings; and/or application systems for any of the previously mentioned equipment or machinery etc.).

The afore-mentioned "communication device" may, for example, be an item of transport equipment (for example transport equipment such as: rolling stocks; motor vehicles; motor cycles; bicycles; trains; buses; carts; rickshaws; ships and other watercraft; aircraft; rockets; satellites; drones; balloons etc.).

The afore-mentioned "communication device" may, for example, be an item of information and communication equipment (for example information and communication equipment such as: electronic computer and related equipment; communication and related equipment; electronic components etc.).

The afore-mentioned "communication device" may, for example, be a refrigerating machine, a refrigerating machine applied product, an item of trade and/or service industry equipment, a vending machine, an automatic service machine, an office machine or equipment, a consumer electronic and electronic appliance (for example a consumer electronic appliance such as: audio equipment; video equipment; a loud speaker; a radio; a television; a microwave oven; a rice cooker; a coffee machine; a dishwasher; a washing machine; a dryer; an electronic fan or related appliance; a cleaner etc.).

The afore-mentioned "communication device" may, for example, be an electrical application system or equipment (for example an electrical application system or equipment such as: an x-ray system; a particle accelerator; radio isotope equipment; sonic equipment; electromagnetic application equipment; electronic power application equipment etc.).

The afore-mentioned "communication device" may, for example, be an electronic lamp, a luminaire, a measuring instrument, an analyzer, a tester, or a surveying or sensing instrument (for example a surveying or sensing instrument such as: a smoke alarm; a human alarm sensor; a motion sensor; a wireless tag etc.), a watch or clock, a laboratory instrument, optical apparatus, medical equipment and/or system, a weapon, an item of cutlery, a hand tool, or the like.

The afore-mentioned "communication device" may, for example, be a wireless-equipped personal digital assistant or related equipment (such as a wireless card or module designed for attachment to or for insertion into another electronic device (for example a personal computer, electrical measuring machine)).

The afore-mentioned "communication device" may be a device or a part of a system that provides applications, services, and solutions described below, as to "internet of things (IoT)", using a variety of wired and/or wireless communication technologies.

Internet of Things devices (or "things") may be equipped with appropriate electronics, software, sensors, network connectivity, and/or the like, which enable these devices to collect and exchange data with each other and with other communication devices. IoT devices may comprise automated equipment that follow software instructions stored in an internal memory. IoT devices may operate without requiring human supervision or interaction. IoT devices might also remain stationary and/or inactive for a long period of time. IoT devices may be implemented as a part of a (generally) stationary apparatus. IoT devices may also be embedded in non-stationary apparatus (e.g. vehicles) or attached to animals or persons to be monitored/tracked.

It will be appreciated that IoT technology can be implemented on any communication devices that can connect to a communications network for sending/receiving data, regardless of whether such communication devices are controlled by human input or software instructions stored in memory.

It will be appreciated that IoT devices are sometimes also referred to as Machine-Type Communication (MTC) devices or Machine-to-Machine (M2M) communication devices. It will be appreciated that the afore-mentioned "communication device" may support one or more IoT or MTC applications. Some examples of MTC applications are listed in the following table (source: 3GPP TS 22.368 V13.1.0, Annex B, the contents of which are incorporated herein by reference). This list is not exhaustive and is intended to be indicative of some examples of machine-type communication applications.

TABLE 1

| Service Area | MTC applications |
| --- | --- |
| Security | Surveillance systems |
| | Backup for landline |
| | Control of physical access (e.g. to buildings) |
| | Car/driver security |
| Tracking & Tracing | Fleet Management |
| | Order Management |
| | Pay as you drive |

TABLE 1-continued

| Service Area | MTC applications |
| --- | --- |
| | Asset Tracking |
| | Navigation |
| | Traffic information |
| | Road tolling |
| | Road traffic optimisation/steering |
| Payment | Point of sales |
| | Vending machines |
| | Gaming machines |
| Health | Monitoring vital signs |
| | Supporting the aged or handicapped |
| | Web Access Telemedicine points |
| | Remote diagnostics |
| Remote Maintenance/Control | Sensors |
| | Lighting |
| | Pumps |
| | Valves |
| | Elevator control |
| | Vending machine control |
| | Vehicle diagnostics |
| Metering | Power |
| | Gas |
| | Water |
| | Heating |
| | Grid control |
| | Industrial metering |
| Consumer Devices | Digital photo frame |
| | Digital camera |
| | eBook |

Applications, services, and solutions may be an MVNO (Mobile Virtual Network Operator) service, an emergency radio communication system, a PBX (Private Branch eXchange) system, a PHS/Digital Cordless Telecommunications system, a POS (Point of sale) system, an advertise calling system, an MBMS (Multimedia Broadcast and Multicast Service), a V2X (Vehicle to Everything) system, a train radio system, a location related service, a Disaster/Emergency Wireless Communication Service, a community service, a video streaming service, a femto cell application service, a VoLTE (Voice over LTE) service, a charging service, a radio on demand service, a roaming service, an activity monitoring service, a telecom carrier/communication NW selection service, a functional restriction service, a PoC (Proof of Concept) service, a personal information management service, an ad-hoc network/DTN (Delay Tolerant Networking) service, etc.

Further, the above-described "communication device" categories are merely examples of applications of the technical ideas and exemplary embodiments described in the present document. Needless to say, these technical ideas and embodiments are not limited to the above-described "communication device" and various modifications can be made thereto.

6. SUPPLEMENTAL NOTES

An illustrative embodiment is applicable to 3GPP LTE MU-MIMO systems. The present invention may be embodied in other specific forms without departing from the spirit or essential characteristics thereof. The above-described illustrative embodiment and examples are therefore to be considered in all respects as illustrative and not restrictive, the scope of the invention being indicated by the appended claims rather than by the foregoing description, and all changes which come within the meaning and range of equivalency of the claims are therefore intended to be embraced therein. Part or all of the above-described illustrative embodiments can also be described as, but are not limited to, the following supplemental notes.

(Supplemental Note 1)

A communication apparatus comprising:
- a decoder for polar codes, that decodes a codeword in which a frame is partitioned according to a predetermined partitioning rule and each partition includes at least one check bit computed by a predefined checksum equation;
- a memory that stores a frozen set including frozen bit indices, a non-frozen set including non-frozen bit indices, and a susceptible to error (STE) set including STE indices susceptible to decoding error for each partition; and
- a controller configured to:
  - compute a check sum of at least one decoded bit for each partition according to the predefined checksum equation;
  - responsive to failure of checksum, initiate a recurrent decoding attempt on the partition; and
  - perform a bit-inversion operation on at least one STE index in each recurrent decoding attempt.

(Supplemental Note 2)

The communication apparatus according to supplemental note 1, wherein the controller is configured to initiate the recurrent decoding attempt from at least one of: a) start of the frame; and b) start of the partition.

(Supplemental Note 3)

The communication apparatus according to supplemental note 2, wherein if the recurrent decoding attempt is not initiated from the start of a frame, then the intermediate decoding states of the decoder from at least one non-start index of the frame are further stored in the memory.

(Supplemental Note 4)

The communication apparatus according to supplemental note 3 wherein the decoder initiates the recurrent decoding attempt from a first index that follows an intermediate index corresponding to the intermediate decoding states of the decoder stored in the memory.

(Supplemental Note 5)

The communication apparatus according to supplemental note 1, wherein the partitioning rule is dependent on at least one of location and number of STE indices.

(Supplemental Note 6)

The communication apparatus according to supplemental note 1, wherein a confidence value of a decoded bit of the at least one STE index of the partition is used to sort STE indices of the STE set in ascending order of the confidence value.

(Supplemental Note 7)

The communication apparatus according to supplemental note 6 wherein the decoded bit of at least one index sequentially selected from the sorted STE set is inverted in each recurrent decoding attempt.

(Supplemental Note 8)

The communication apparatus according to supplemental note 1, wherein the predetermined partitioning rule ensures that every partition has one or more STE indices.

(Supplemental Note 9)

The communication apparatus according to supplemental note 1, wherein the checksum in each partition is computed using the at least one decoded bit at one or more STE index.

(Supplemental Note 10)

The communication apparatus according to supplemental note 1, wherein the recurrent decoding attempt is repeated till a predetermined number of times, or till the partition is decoded without any error, whichever earlier.

(Supplemental Note 11)

The communication apparatus according to supplemental note 1, wherein the checksum is at least one of a parity check or a cyclic redundancy check, or a hash code.

(Supplemental Note 12)

The communication apparatus according to supplemental note 1 wherein the STE set of indices is a subset of the non-frozen set of indices.

(Supplemental Note 13)

The communication apparatus according to supplemental note 1, wherein at least an absolute value of log-likelihood ratio from at least one STE index of at least one partition is used as confidence value to sort the STE indices from lowest to highest value of absolute LLR.

(Supplemental Note 14)

The communication apparatus according to supplemental note 13 wherein, a decoded bit of at least one index from the sorted STE set is inverted in each recurrent decoding attempt.

(Supplemental Note 15)

The communication apparatus according to supplemental note 1 wherein the STE set is obtained by at least one of:
- a) finding the probability of occurrence of first decoding error at each index of the frame by offline computation, and, listing up the indices that have relatively high probability of occurrence of first decoding error by comparing with a threshold, and
- b) dividing a polar coding tree into subtrees such that each subtree has all leaf nodes as non-frozen nodes, and, selecting the first leaf node of each subtree.

(Supplemental Note 16)

The communication apparatus according to supplemental note 1 wherein the decoder uses at least one of a successive cancellation decoding and successive cancellation list decoding algorithm.

(Supplemental Note 17)

The communication apparatus according to supplemental note 1 wherein if checksum failure in a recurrent decoding attempt happens for a maximum number of times, the frame is discarded.

(Supplemental Note 18)

A communication method in a communication device, comprising:
- by a decoder for polar codes, decoding the codeword in which a frame is partitioned according to a predetermined partitioning rule, and each partition includes at least one check bit computed by a predefined checksum equation,
- by a memory, storing a frozen set including frozen bit indices, a non-frozen set including non-frozen bit indices, and a susceptible to error (STE) set including STE indices susceptible to decoding error for each partition;
- by a controller,
  - computing a check sum of at least one decoded bit for each partition according to the predefined checksum equation;
  - responsive to failure of checksum, initiating a recurrent decoding attempt on the partition; and
  - performing a bit-inversion operation on at least one STE index in each recurrent decoding attempt.

(Supplemental Note 19)

A communication system comprising:
- a sender device including an encoder for polar codes, that sends a codeword, wherein a frame is partitioned according to a predetermined partitioning rule, each partition including at least one check bit computed by a predefined checksum equation; and a receiver device including:
- a decoder for polar codes, that decodes the codeword received from the sender device;
- a memory that stores a frozen set including frozen bit indices, a non-frozen set including non-frozen bit indices, and a susceptible to error (STE) set including STE indices susceptible to decoding error for each partition; and
- a controller configured to: compute a check sum of at least one decoded bit for each partition according to the predefined checksum equation; responsive to failure of checksum, initiate a recurrent decoding attempt on the partition; and perform a bit-inversion operation on at least one STE index in each recurrent decoding attempt.

(Supplemental Note 20)

A computer-readable program stored in a non-transitory recoding medium in a communication device which receives a codeword in which a frame is partitioned according to a predetermined partitioning rule and each partition includes at least one check bit computed by a predefined checksum equation, the program comprising a set of instructions to:
- decode the codeword;
- store a frozen set including frozen bit indices, a non-frozen set including non-frozen bit indices, and a susceptible to error (STE) set including STE indices susceptible to decoding error for each partition;
- compute a check sum of at least one decoded bit for each partition according to the predefined checksum equation;
- responsive to failure of checksum, initiate a recurrent decoding attempt on the partition; and
- perform a bit-inversion operation on at least one STE index in each recurrent decoding attempt.

(Supplemental Note 21)

A non-transitory recoding medium storing the computer-readable program according to supplemental note 20.

(Supplemental Note 22)

A communication apparatus comprising:
- a memory that stores a frozen set including frozen bit indices, a non-frozen set including non-frozen bit indices, and a susceptible to error (STE) set including STE indices susceptible to decoding error for each partition;
- an encoder for polar codes, that encodes an input vector to output a codeword; and
- a controller configured to:
  - partition a frame into at least one partition according to a predetermined partitioning rule based on the STE indices, each partition including at least one check bit computed by a predefined checksum equation; and
  - construct the input vector by putting information bits, the at least one check bit and frozen bits in the frame.

(Supplemental Note 23)

The communication apparatus according to supplemental note 22, wherein the partitioning rule is dependent on at least one of location and number of STE indices.

(Supplemental Note 24)

The communication apparatus according to supplemental note 22, wherein the predetermined partitioning rule ensures that every partition has one or more STE indices.

(Supplemental Note 25)

The communication apparatus according to supplemental note 22, wherein the checksum is at least one of a parity check or a cyclic redundancy check, or a hash code.

(Supplemental Note 26)

The communication apparatus according to supplemental note 22 wherein the STE set of indices is a subset of the non-frozen set of indices.

REFERENCE SIGNS LIST

100 Sender device
102 FEC Encoder
103 Modulator
104 Pre-processing controller
105 Frozen set memory
106 STE set memory
107 Partitioning memory
300 Receiver device
301 Demodulator
302 FEC Decoder
303 Decoded message processor
304 Decoder controller
305 Sorted STE set memory
306 Decoder memory

What is claimed is:

1. A communication apparatus comprising:
   a decoder for polar codes, that decodes a codeword in which a frame is partitioned according to a predetermined partitioning rule and each partition includes at least one check bit computed by a predefined checksum equation;
   a memory that stores a frozen set including frozen bit indices, a non-frozen set including non-frozen bit indices, and a susceptible to error (STE) set including STE indices susceptible to decoding error for each partition; and
   a controller configured to:
      compute a check sum of at least one decoded bit for each partition according to a predefined checksum equation;
      responsive to failure of checksum, initiate a recurrent decoding attempt on the partition;
      if the recurrent decoding attempt is not initiated from the start of a frame, store an intermediate decoding state of the decoder from at least one non-start index of the frame in the memory;
      initiate the recurrent decoding attempt from a first index that follows an intermediate index corresponding to the intermediate decoding state of the decoder stored in the memory; and
      perform a bit-inversion operation on at least one STE index in each recurrent decoding attempt.

2. The communication apparatus according to claim 1, wherein the intermediate decoding state is stored after completion of decoding of a partition, or at the index before an STE index.

3. The communication apparatus according to claim 1, wherein the partitioning rule is dependent on at least one of location and number of STE indices.

4. The communication apparatus according to claim 1, wherein a confidence value of a decoded bit of the at least one STE index of the partition is used to sort STE indices of the STE set in ascending order of the confidence value.

5. The communication apparatus according to claim 1, wherein the predetermined partitioning rule ensures that every partition has one or more STE indices.

6. The communication apparatus according to claim 1, wherein the checksum in each partition is computed using the at least one decoded bit at one or more STE index.

7. The communication apparatus according to claim 1, wherein the recurrent decoding attempt is repeated till a predetermined number of times, or till the partition is decoded without any error, whichever earlier.

8. The communication apparatus according to claim 1, wherein the checksum is at least one of a parity check or a cyclic redundancy check, or a hash code.

9. The communication apparatus according to claim 1 wherein the STE set of indices is a subset of the non-frozen set of indices.

10. The communication apparatus according to claim 1, wherein at least an absolute value of log-likelihood ratio from at least one STE index of at least one partition is used as confidence value to sort the STE indices from lowest to highest value of absolute LLR.

11. The communication apparatus according to claim 1, wherein the intermediate decoding state is stored as a log-likelihood ratio (LLR) value and a partial sum of at least one node in a decoding graph that have been computed till the decoding of last bit of the partition.

12. The communication apparatus according to claim 1 wherein the STE set is obtained by at least one of:
finding the probability of occurrence of first decoding error at each index of the frame by offline computation, and, listing up the indices that have relatively high probability of occurrence of first decoding error by comparing with a threshold, and
dividing a polar coding tree into subtrees such that each subtree has all leaf nodes as non-frozen nodes, and, selecting the first leaf node of each subtree.

13. The communication apparatus according to claim 1 wherein the decoder uses at least one of a successive cancellation decoding and successive cancellation list decoding algorithm.

14. The communication apparatus according to claim 1 wherein if checksum failure in a recurrent decoding attempt happens for a maximum number of times, the frame is discarded.

15. A communication method in a communication device, comprising:
by a decoder for polar codes, decoding the codeword in which a frame is partitioned according to a predetermined partitioning rule and each partition includes at least one check bit computed by a predefined checksum equation;
by a memory, storing a frozen set including frozen bit indices, a non-frozen set including non-frozen bit indices, and a susceptible to error (STE) set including STE indices susceptible to decoding error for each partition;
by a controller,
computing a check sum of at least one decoded bit for each partition according to the predefined checksum equation;
responsive to failure of checksum, initiating a recurrent decoding attempt on the partition;
if the recurrent decoding attempt is not initiated from the start of a frame, storing an intermediate decoding state of the decoder from at least one non-start index of the frame in the memory;
initiating the recurrent decoding attempt from a first index that follows an intermediate index corresponding to the intermediate decoding state of the decoder stored in the memory; and
performing a bit-inversion operation on at least one STE index in each recurrent decoding attempt.

16. A communication apparatus comprising:
a memory that stores a frozen set including frozen bit indices, a non-frozen set including non-frozen bit indices, and a susceptible to error (STE) set including STE indices susceptible to decoding error for each partition;
an encoder for polar codes, that encodes an input vector to output a codeword;
a controller configured to:
partition a frame into at least one partition according to a predetermined partitioning rule based on the STE indices, each partition including at least one check bit computed by a predefined checksum equation; and
construct the input vector by putting information bits, the at least one check bit and frozen bits in the frame; and
a decoder for polar codes, that decodes a codeword in which a received frame is partitioned according to the predetermined partitioning rule,
wherein the controller is further configured to:
compute a check sum of at least one decoded bit for each partition;
responsive to failure of the checksum, initiate a recurrent decoding attempt on the partition of the received frame;
if the recurrent decoding attempt is not initiated from the start of the received frame, store an intermediate decoding state of the decoder from at least one non-start index of the received frame in the memory;
initiate the recurrent decoding attempt from a first index that follows an intermediate index corresponding to the intermediate decoding state of the decoder stored in the memory; and
perform a bit-inversion operation on at least one STE index in each recurrent decoding attempt.

17. The communication apparatus according to claim 16, wherein the partitioning rule is dependent on at least one of location and number of STE indices.

18. The communication apparatus according to claim 16, wherein the predetermined partitioning rule ensures that every partition has one or more STE indices.

19. The communication apparatus according to claim 16, wherein the checksum is at least one of a parity check or a cyclic redundancy check, or a hash code.

20. The communication apparatus according to claim 16 wherein the STE set of indices is a subset of the non-frozen set of indices.

* * * * *